United States Patent
Sasaki et al.

(10) Patent No.: US 9,818,881 B2
(45) Date of Patent: Nov. 14, 2017

(54) SEMICONDUCTOR DEVICE AND MANUFACTURING METHOD OF SEMICONDUCTOR DEVICE

(71) Applicant: Japan Display Inc., Tokyo (JP)

(72) Inventors: Toshinari Sasaki, Tokyo (JP); Isao Suzumura, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 15/230,915

(22) Filed: Aug. 8, 2016

(65) Prior Publication Data

US 2017/0054028 A1    Feb. 23, 2017

(30) Foreign Application Priority Data

Aug. 20, 2015 (JP) .................. 2015-162421

(51) Int. Cl.
| | |
|---|---|
| *H01L 29/10* | (2006.01) |
| *H01L 29/12* | (2006.01) |
| *H01L 29/786* | (2006.01) |
| *H01L 29/423* | (2006.01) |
| *H01L 29/66* | (2006.01) |
| *H01L 21/4757* | (2006.01) |
| *H01L 21/465* | (2006.01) |
| *H01L 29/40* | (2006.01) |

(52) U.S. Cl.
CPC ........ *H01L 29/7869* (2013.01); *H01L 21/465* (2013.01); *H01L 21/47573* (2013.01); *H01L 29/401* (2013.01); *H01L 29/42384* (2013.01); *H01L 29/66969* (2013.01)

(58) Field of Classification Search
USPC ....... 257/223, 227, 291, 292, 439, 443, 655, 257/E27.125, E27.112, E29.117, E29.145, 257/E29.147, E29.151, E29.182, E29.202, 257/E29.273–E29.299, E29.314, E29.32, 257/E23.016; 438/149, 163
See application file for complete search history.

(56) References Cited

U.S. PATENT DOCUMENTS 8,901,557 B2 * 12/2014 Yamazaki ......... H01L 29/78693
257/43
2015/0014680 A1 * 1/2015 Yamazaki ........... H01L 27/1225
257/43

FOREIGN PATENT DOCUMENTS

| JP | 2010-62229 A | 3/2010 |
|---|---|---|
| JP | 2012-62229 A | 3/2010 |

* cited by examiner

*Primary Examiner* — Tram H Nguyen
(74) *Attorney, Agent, or Firm* — Typha IP LLC

(57) ABSTRACT

A semiconductor device includes an oxide semiconductor layer, a gate electrode facing the oxide semiconductor layer, a gate insulating layer between the oxide semiconductor layer and the gate electrode, a first barrier layer below the oxide semiconductor layer, and a second barrier layer above the oxide semiconductor layer, the second barrier layer covering a top surface and side surfaces of the oxide semiconductor layer and being in contact with the first barrier layer in a region around the oxide semiconductor layer.

18 Claims, 30 Drawing Sheets

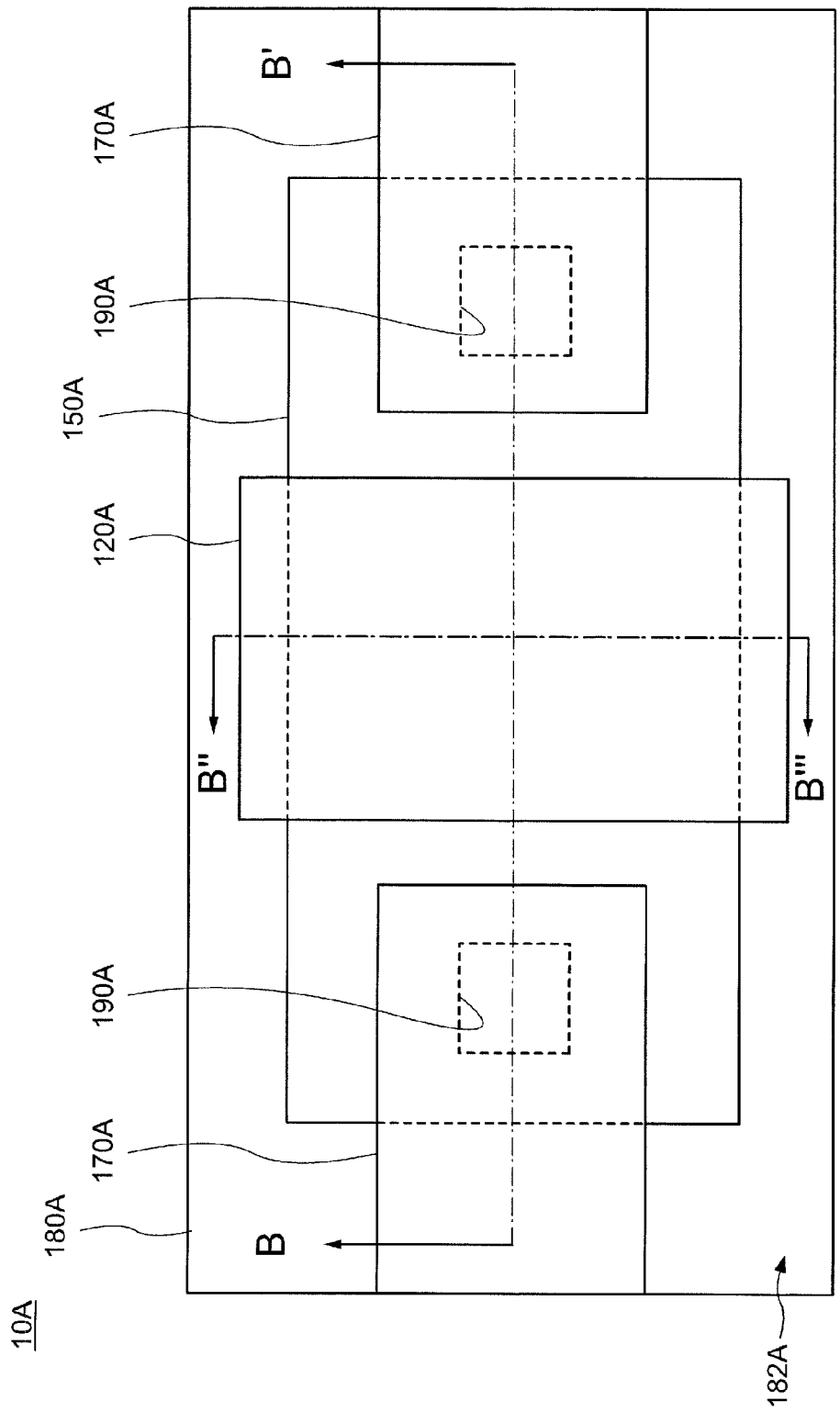

SEMICONDUCTOR DEVICE AND MANUFACTURING METHOD OF SEMICONDUCTOR DEVICE

CROSS REFERENCE TO RELATED APPLICATIONS

This application is based upon and claims the benefit of priority from the prior Japanese Patent Application No. 2015-162421 filed on Aug. 20, 2015, the entire contents of which are incorporated herein by reference.

FIELD

The present invention relates to a semiconductor device and a manufacturing method of the semiconductor device.

Recently, a driving circuit of a display device, a personal computer or the like includes a semiconductor device such as a transistor, a diode or the like as a microscopic switching element. Especially in a display device, a semiconductor device is used as a selective transistor that supplies a voltage or a current in accordance with the gray scale of each of pixels and also used in a driving circuit that selects a pixel to which the voltage or the current is to be supplied. The characteristics required of a semiconductor device vary in accordance with the use thereof. For example, a semiconductor device used as a selective transistor is required to have a low off-current or little variance from another selective semiconductor. A semiconductor device used in a driving circuit is required to have a high on-current.

To be used in a display device as described above, a semiconductor device including a channel formed of amorphous silicon, low-temperature polysilicon or single crystalline silicon has been conventionally developed. The semiconductor device including a channel formed of amorphous silicon or low-temperature polysilicon is formed in a process of 600☐C or lower, and therefore can be formed by use of a glass substrate. Especially, a semiconductor device including a channel formed of amorphous silicon can be formed with a simpler structure and in a process of 400☐C or lower, and therefore can be formed, for example, by use of a large glass substrate referred to as an eighth-generation glass substrate (2160 ☐ 2460 mm). However, such a semiconductor device including a channel formed of amorphous silicon has a low mobility and is not usable in a driving circuit.

A semiconductor device including a channel formed of low-temperature polysilicon or single crystalline silicon has a higher mobility than the semiconductor device including a channel formed of amorphous silicon, and therefore is usable as a selective transistor and also in a driving circuit. However, such a semiconductor device including a channel formed of low-temperature polysilicon or single crystalline silicon has a complicated structure and needs a complicated process to be manufactured. In addition, such a semiconductor device needs to be formed in a process of 500☐C or higher, and therefore cannot be formed by use of a large glass substrate as described above. A semiconductor device including a channel formed of amorphous silicon, low-temperature polysilicon or single crystalline silicon has a high off-current. In the case where such a semiconductor device is used as a selective transistor, it is difficult to keep the applied voltage for a long time.

For the above-described reasons, a semiconductor device including a channel formed of an oxide semiconductor, instead of amorphous silicon, low-temperature polysilicon or single crystalline silicon, has been progressively developed recently (e.g., Japanese Laid-Open Patent Publication No. 2010-062229). It is known that a semiconductor device including a channel formed of an oxide semiconductor can be formed with a simple structure and in a low-temperature process like a semiconductor device including a channel formed of amorphous silicon, and has a mobility higher than that of a semiconductor device including a channel formed of amorphous silicon. It is also known that such a semiconductor device including a channel formed of an oxide semiconductor has a very low off-current.

However, an oxide semiconductor is easily influenced by moisture and impurities. Especially when moisture or impurities enter an oxide semiconductor layer used for a channel, there occurs a problem that the characteristics of the semiconductor device are varied. In order to solve this problem, it has been studied to provide a barrier layer, having a blocking characteristic against moisture or impurities, below and above the oxide semiconductor layer. However, such a barrier layer does not sufficiently block moisture or impurities from entering the oxide semiconductor layer from the sides thereof, which causes a problem that the reliability of the semiconductor device is decreased.

SUMMARY

A semiconductor device in an embodiment according to the present invention includes an oxide semiconductor layer, a gate electrode facing the oxide semiconductor layer, a gate insulating layer between the oxide semiconductor layer and the gate electrode, a first barrier layer below the oxide semiconductor layer, and a second barrier layer above the oxide semiconductor layer, the second barrier layer covering a top surface and side surfaces of the oxide semiconductor layer and being in contact with the first barrier layer in a region around the oxide semiconductor layer.

A manufacturing method of a semiconductor device in an embodiment according to the present invention includes forming a first barrier layer, forming a first oxide layer above the first barrier layer, forming an oxide semiconductor layer above the first oxide layer, performing fluorine etching using fluorine-containing gas on a region of the first oxide layer exposed from the oxide semiconductor layer to expose a region of the first barrier layer, forming a second oxide layer above the oxide semiconductor layer, the second oxide layer partially exposing the oxide semiconductor layer, and forming a second barrier layer in contact with the exposed region of the first barrier layer in a region surrounding the oxide semiconductor layer.

A manufacturing method of a semiconductor device in an embodiment according to the present invention includes forming a first barrier layer, forming a first oxide layer above the first barrier layer, forming an oxide semiconductor layer above the first oxide layer, forming a second oxide layer above the oxide semiconductor layer, performing fluorine etching using fluorine-containing gas on a region of the second oxide layer exposed from a mask partially covering the oxide semiconductor layer and on a region of the first oxide layer exposed from the oxide semiconductor layer to expose a region of the first barrier layer, and forming a second barrier layer in contact with the exposed region of the first barrier layer in a region surrounding the oxide semiconductor layer.

BRIEF DESCRIPTION OF DRAWINGS

FIG. 17 is a plan view showing an overview of a semiconductor device in an embodiment according to the present invention;

DESCRIPTION OF EMBODIMENTS

Figure 1:
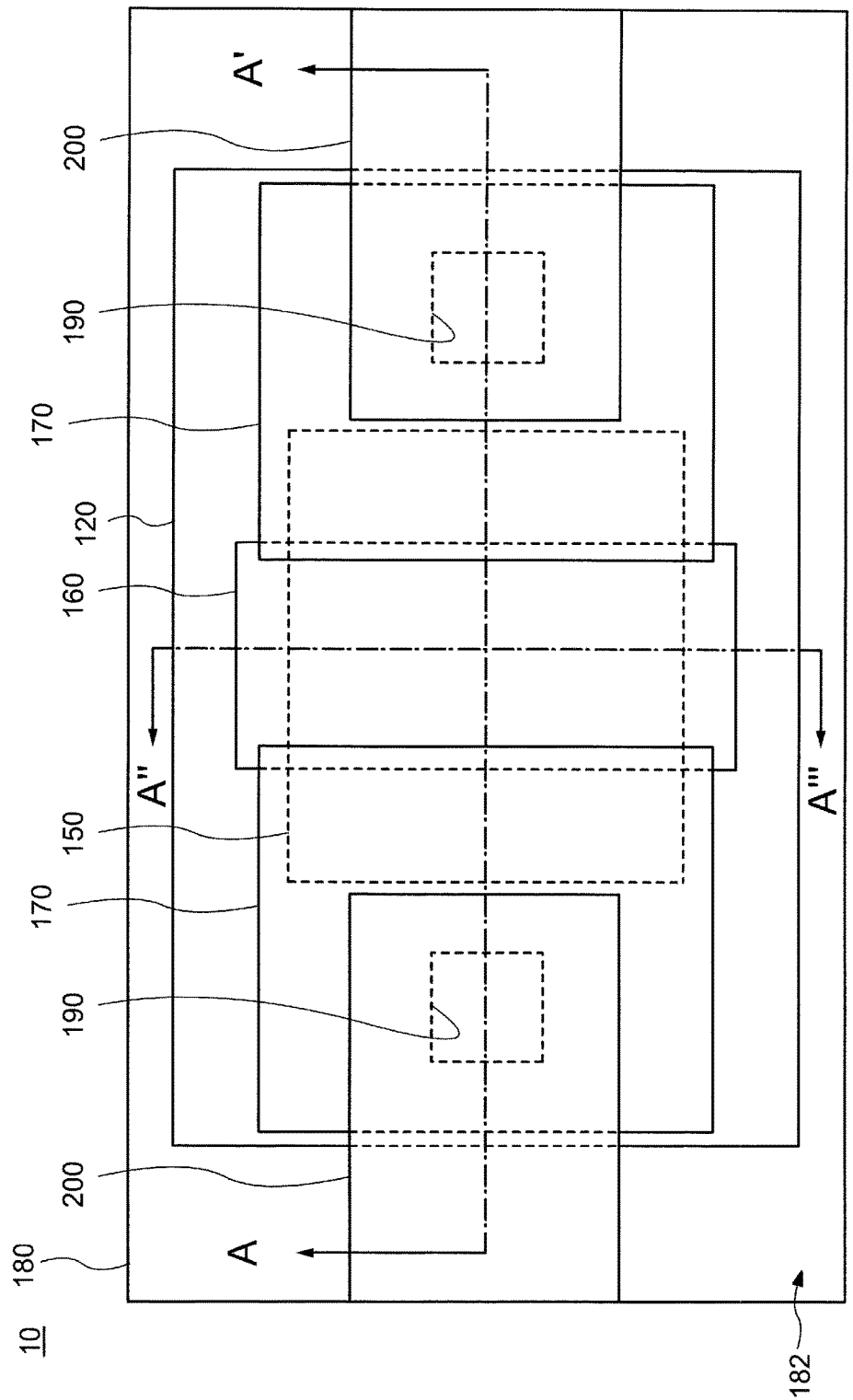
FIG. 1 is a plan view showing an overview of a semiconductor device in an embodiment according to the present invention.

Hereinafter, embodiments of the present invention will be described with reference to the drawings. The disclosure is merely exemplary, and alternations and modifications easily conceivable by a person of ordinary skill in the art without departing from the gist of the present invention are duly encompassed in the scope of the present invention. In the drawings, components may be shown schematically regarding the width, thickness, shape and the like, instead of being shown in accordance with the actual sizes, for the sake of clear illustration. The drawings are merely exemplary and do not limit the interpretations of the present invention in any way. In the specification and the drawings, components that are substantially the same as those shown in a previous drawing(s) bear the identical reference signs thereto, and detailed descriptions thereof may be omitted. The following embodiments are presented for the purpose of providing a highly reliable semiconductor device and a manufacturing method of such a semiconductor device.

Embodiment 1

Figure 2A:
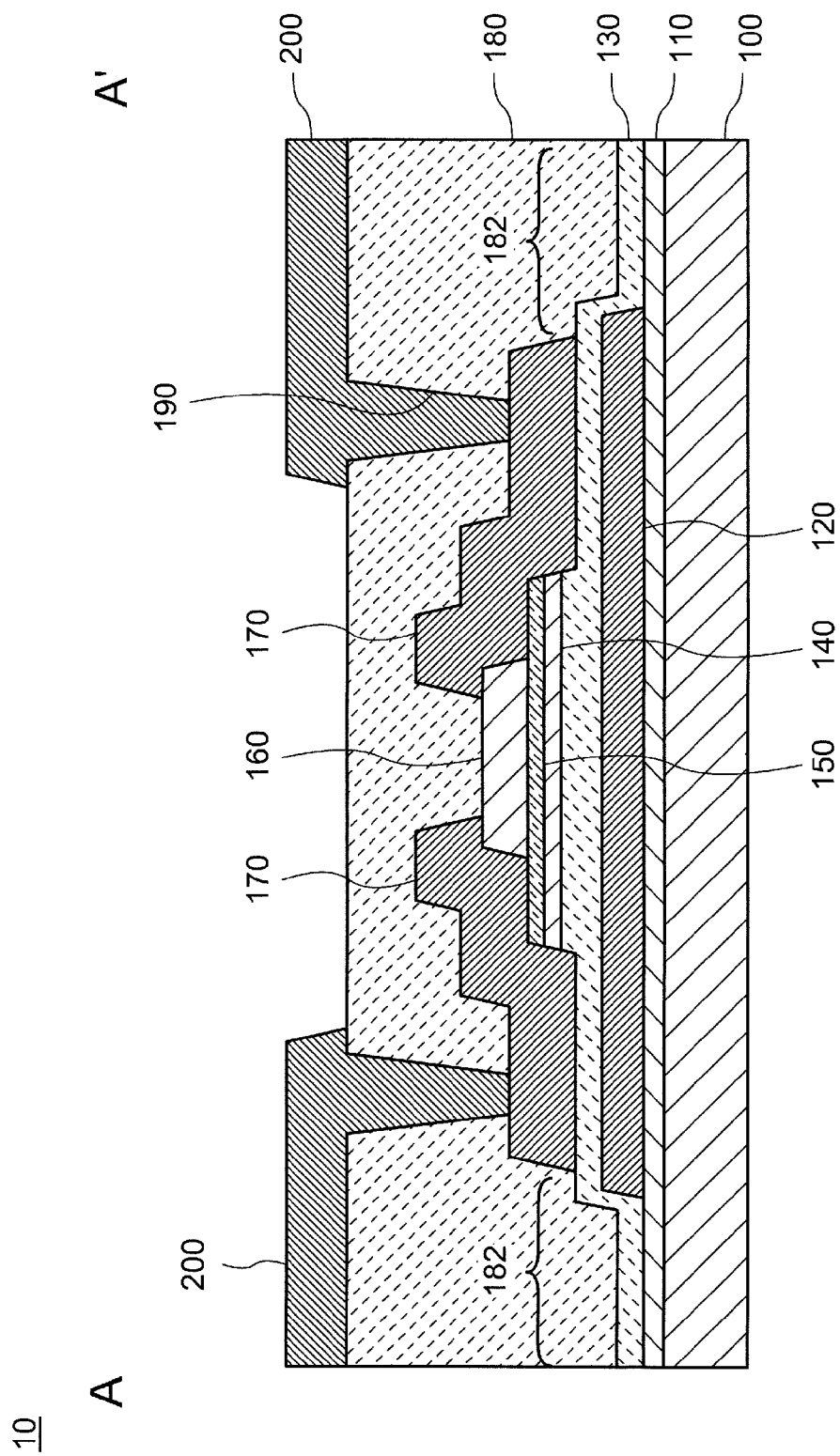
FIG. 2A is a cross-sectional view showing an overview of the semiconductor device in the embodiment according to the present invention, taken along line A-A' in FIG. 1.
Figure 2B:
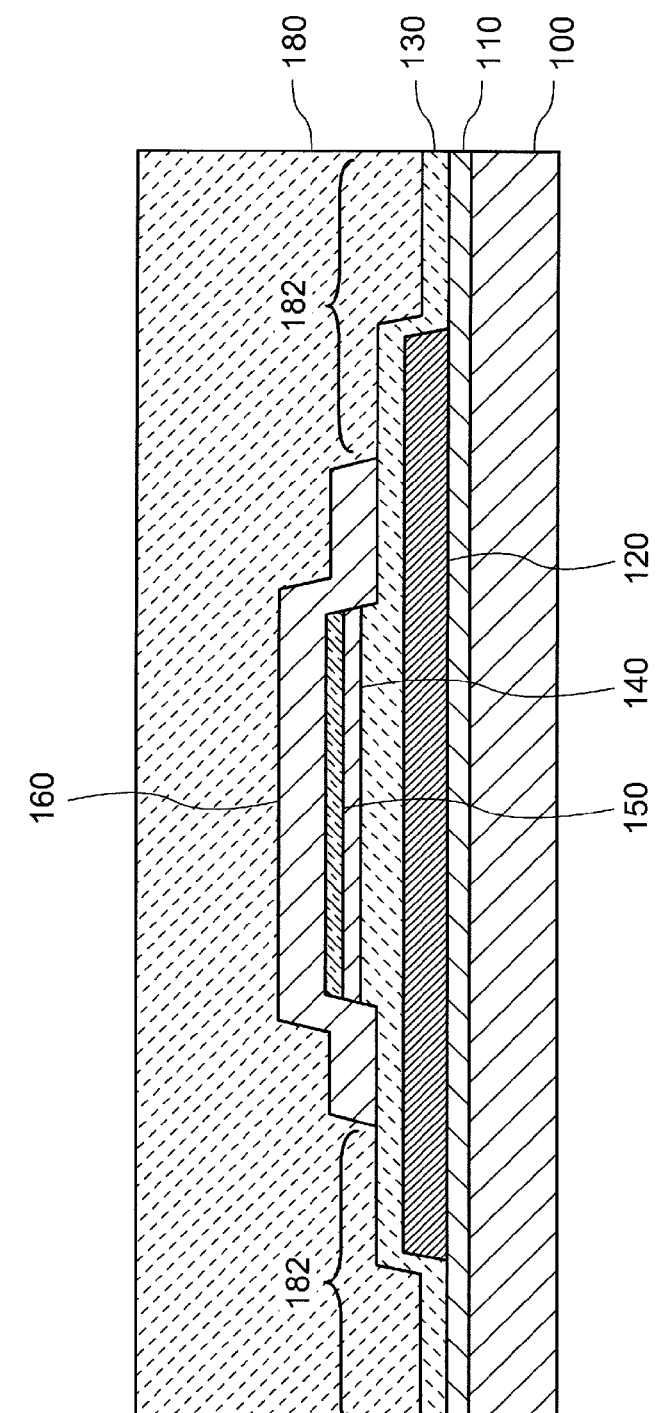
FIG. 2B is a cross-sectional view showing an overview of the semiconductor device in the embodiment according to the present invention, taken along line A"-A" in FIG. 1.

With reference to FIGS. 1, 2A and 2B, an overview of a semiconductor device 10 in embodiment 1 according to the present invention will be described. The semiconductor device 10 in embodiment 1 is usable in a pixel or a driving circuit of a liquid crystal display device (LCD), a spontaneous emission display device using an organic light-emitting diode (OLED) such as an organic EL element, a quantum dot or the like for a display unit, or a reflection-type display device such as an electronic paper or the like.

It should be noted that a semiconductor device according to the present invention is not limited to being used in a display device, and may be used in, for example, an integrated circuit (IC) such as a microprocessing unit (MPU) or the like. The semiconductor device 10 in embodiment 1 has a structure including a channel formed of an oxide semiconductor. In embodiment 1, the semiconductor device 10 is a transistor. This does not limit the semiconductor device according to the present invention to being a transistor.

[Structure of the Semiconductor Device 10]

FIG. 1 is a plan view showing an overview of the semiconductor device 10 in embodiment 1 according to the present invention. FIG. 2A is a cross-sectional view showing an overview of the semiconductor device 10 in embodiment 1 according to the present invention, taken along line A-A' in FIG. 1. FIG. 2B is a cross-sectional view showing an overview of the semiconductor device 10 in the embodiment according to the present invention, taken along line A"-A" in FIG. 1. As shown in FIG. 1, FIG. 2A and FIG. 2B, the semiconductor device 10 includes a substrate 100, an underlying layer 110, a gate electrode 120, a gate insulating layer (a first barrier layer 130 and a first oxide layer 140), an oxide semiconductor layer 150, a second oxide layer 160, source and drain electrodes 170, a second barrier layer 180, and an upper wiring line 200. The semiconductor device 10 is a bottom gate-type transistor.

The underlying layer 110 is located above the substrate 100. The gate electrode 120 is located above the underlying layer 110. The first barrier layer 130 is located above the gate electrode 120 and above the underlying layer 110. The first oxide layer 140 is located above the first barrier layer 130. The oxide semiconductor layer 150 is located above the first oxide layer 140. The oxide semiconductor layer 150 is in contact with the first oxide layer 140. The first oxide layer 140 is located only below the oxide semiconductor layer 150, and is removed from a region other than a region below the oxide semiconductor layer 150. Namely, the first oxide layer 140 has substantially the same pattern as that of the oxide semiconductor layer 150 as seen in a plan view. A region of the first barrier layer 130 that is exposed from the first oxide layer 140 is thinner than a region of the first barrier layer 130 that is below the first oxide layer 140. Namely, the first oxide layer 140 is completely removed from the region other than the region below the oxide semiconductor layer 150, and the region of the first barrier layer 130 that is exposed from the first oxide layer 140 is over-etched.

The above-described structure may be expressed as follows. The gate electrode 120 may be described as being located below the oxide semiconductor layer 150 while facing the oxide semiconductor layer 150. The gate insulating layer (the first barrier layer 130 and the first oxide layer 140) may be described as being located between the oxide semiconductor layer 150 and the gate electrode 120. The first barrier layer 130 may be described as being located below the oxide semiconductor layer 150. The expression "located below" indicates that one layer is at a position below another layer in a structure including a stack of a plurality of layers, but does not necessarily indicate that one layer is in contact with another layer as seen in a cross-sectional view. The first oxide layer 140 may be described as being located between the oxide semiconductor layer 150 and the first barrier layer 130.

As shown in FIG. 2A, the second oxide layer 160 is located above a region of the oxide semiconductor layer 150 that includes a region acting as a channel. As shown in FIG. 2B, the second oxide layer 160 covers a top surface and side surfaces of the oxide semiconductor layer 150 in a region where the source and drain electrodes 170 are not located above the oxide semiconductor layer 150. As shown in both of FIG. 2A and FIG. 2B, the second oxide layer 160 is in contact with the oxide semiconductor layer 150. The source and drain electrodes 170 are located above the oxide semiconductor layer 150, above the second oxide layer 160 and above the region of the first barrier layer 130 that is exposed from the first oxide layer 140. The source and drain electrodes 170 are connected with the oxide semiconductor layer 150. The source and drain electrodes 170 are a pair of electrodes separated from each other while having a distance therebetween. In accordance with the applied voltage, one of the pair of electrodes is the source electrode and the other is the drain electrode. A region of the oxide semiconductor layer 150 that is between regions thereof that are in contact with the pair of electrodes corresponds to a channel length of the semiconductor device 10. Namely, the width of the second oxide layer 160 corresponds to the channel length of the semiconductor device 10.

The second barrier layer 180 is located above the source and drain electrodes 170, above the second oxide layer 160 and above the first barrier layer 130. In other words, the second barrier layer 180 is located above the oxide semiconductor layer 150, and covers the top surface and the side surfaces of the oxide semiconductor layer 150. The second barrier layer 180 is in contact with the first barrier layer 130 in a barrier layer contact region 182 outer to the source and drain electrodes 170 and the second oxide layer 160. The barrier layer contact region 182 is located around the oxide semiconductor layer 150. In other words, the oxide semiconductor layer 150 may be described as being wrapped by the first barrier layer 130 and the second barrier layer 180.

The second barrier layer 180 has openings 190 formed therein, the openings 190 partially exposing the source and drain electrodes 170. The above-described structure may be expressed as follows. The second oxide layer 160 may be described as being located between the oxide semiconductor layer 150 and the second barrier layer 180. The source and drain electrodes 170 may be described as being located between the second oxide layer 160 and the second barrier layer 180.

The upper wiring line 200 is located above the second barrier layer 180, and is connected with the source and drain electrodes 170 via the openings 190.

The substrate 100 may be formed of a glass material. Alternatively, the substrate 100 may be formed of a light-transmissive insulating material such as quartz, sapphire, a resin or the like. In the case where the semiconductor device 10 is used in an integrated circuit, not in a display device, the substrate 100 may be formed of a non-light-transmissive material, for example, a semiconductor such as silicon, silicon carbide, a compound semiconductor or the like, or a conductive material such as stainless steel or the like.

The underlying layer 110 may be formed of a material that increases the adhesiveness between the substrate 100 and the gate electrode 120. The underlying layer 110 may be formed of, for example, silicon oxide (SiOx), silicon oxide nitride (SiOxNy), silicon nitride oxide (SiNxOy), silicon nitride (SiNx), aluminum oxide (AlOx), aluminum oxide nitride (AlOxNy), aluminum nitride oxide (AlNxOy), aluminum nitride (AlNx), or the like (x and y each represent an arbitrary positive value). Alternatively, the underlying layer 110 may have a structure including a stack of films of any of such materials. In the case where a sufficient adhesiveness is guaranteed between the substrate 100 and the gate electrode 120, the underlying layer 110 may be omitted. The underlying layer 110 may be formed of a material that suppresses diffusion of impurities from the substrate 100 into the oxide semiconductor layer 150. The underlying layer 110 may be formed of an inorganic insulating material as listed above, TEOS, or an organic insulating material.

SiOxNy and AlOxNy are respectively a silicon compound and an aluminum compound containing nitrogen (N) at a lower content than oxygen (O). SiNxOy and AlNxOy are respectively a silicon compound and an aluminum compound containing oxygen at a lower content than nitrogen.

The underlying layer 110 described above as an example may be formed by a PVD (Physical Vapor Deposition) method or a CVD (Chemical Vapor Deposition) method. Examples of the usable PVD method include sputtering, vacuum vapor deposition, electron beam vapor deposition, plating, molecular beam epitaxy, and the like. Examples of the usable CVD method include thermal CVD, plasma CVD, catalyst CVD (Cat (catalytic)-CVD or hot-wire CVD), and the like. The "TEOS layer" refers to a CVD layer formed of TEOS (Tetra Ethyl Ortho Silicate).

Examples of the usable organic insulating material include a polyimide resin, an acrylic resin, an epoxy resin, a silicone resin, a fluorine resin, a siloxane resin, and the like. The underlying layer 110 may be formed of a single layer or a stack of films of such materials. For example, the underlying layer 110 may include a stack of an inorganic insulating material and an organic insulating material.

The gate electrode 120 may be formed of a commonly used metal material or a commonly used conductive semiconductor material. For example, the gate electrode 120 may be formed of aluminum (Al), titanium (Ti), chromium (Cr), cobalt (Co), nickel (Ni), zinc (Zn), molybdenum (Mo), indium (In), tin (Sn), hafnium (Hf), tantalum (Ta), tungsten (W), platinum (Pt), bismuth (Bi), or the like. Alternatively, the gate electrode 120 may be formed of an alloy of such materials or a nitride of such materials. Still alternatively, the gate electrode 120 may be formed of a conductive oxide semiconductor such as ITO (indium tin oxide), IGO (indium gallium oxide), IZO (indium zinc oxide), GZO (zinc oxide containing gallium as a dopant), or the like. The gate electrode 120 may have a structure including a stack of films of any of such materials.

Preferably, the material used for the gate electrode 120 is resistant to a heat treatment step in a manufacturing process of a semiconductor device including a channel formed of an oxide semiconductor, and has a work function with which the transistor is of an enhancement type that is turned off when a voltage of 0 V is applied to the gate electrode 120.

The first barrier layer 130 may be formed of an inorganic insulating material such as SiNx, SiNxOy, SiOxNy, AlNx, AlNxOy, AlOxNy, or the like. Namely, the first barrier layer 130 may be formed of a material containing nitrogen. Alternatively, the first barrier layer 130 may have a stack of films of any of such insulating materials. The first barrier layer 130 and the underlying layer 110 may be formed of the same material as, or different materials from, each other. Preferably, the first barrier layer 130 is capable of blocking a gas component such as H2O or the like or movable ions of Na or the like. The first barrier layer 130 may be formed by substantially the same method as that of the underlying layer 110.

The first oxide layer 140 may be formed of an inorganic insulating material such as SiOx, SiOxNy, AlOx, AlOxNy, TEOS or the like. Alternatively, the first oxide layer 140 may have a stack of films of any of such insulating materials. The first oxide layer 140 may be formed of a material containing a higher content of oxygen than the first barrier layer 130. The first oxide layer 140 may be formed of a material containing a lower content of hydrogen than the first barrier layer 130. The first oxide layer 140 and the underlying layer 110 may be formed of the same material as, or different materials from, each other. The first oxide layer 140 plays a role of a gate insulating layer in contact with the channel, and thus preferably has a small amount of defects (e.g., dangling bonds, etc.) contained in the film. The first oxide layer 140 may be formed by substantially the same method as that of the underlying layer 110.

The oxide semiconductor layer 150 may be formed of a metal oxide material having the characteristics of a semiconductor. For example, the oxide semiconductor layer 150 may be formed of an oxide semiconductor containing indium (In), gallium (Ga), zinc (Zn) and oxygen (O). Especially, the oxide semiconductor layer 150 may be formed of an oxide semiconductor having a composition ratio of In:Ga:Zn:O=1:1:1:4. It should be noted that the oxide semiconductor used in the present invention and containing In, Ga, Zn and O is not limited to having the above-described composition ratio. An oxide semiconductor having a different composition ratio is also usable. For example, in order to improve the mobility, the ratio of In may be increased. In order to increase the bandgap and thus decrease the influence of light, the ratio of Ga may be increased.

The oxide semiconductor containing In, Ga, Zn and O may contain another element added thereto. For example, a metal element such as Al, Sn or the like may be added. Instead of the above-described oxide semiconductor, zinc oxide (ZnO), nickel oxide (NiO), tin oxide (SnO2), titanium oxide (TiO2), vanadium oxide (VO2), indium oxide (In2O3), strontium titanate (SrTiO3), or the like may be used. The oxide semiconductor layer 150 may be amorphous or crystalline. Alternatively, the oxide semiconductor layer 150 may have a mixed phase of an amorphous phase and a crystalline phase.

The second oxide layer 160 may be formed of an inorganic insulating material such as SiOx, SiOxNy, AlOx, AlOxNy, TEOS or the like. Alternatively, the second oxide layer 160 may have a stack of films of any of such insulating materials. The second oxide layer 160 may be formed of a material containing a higher content of oxygen than the second barrier layer 180 located above the second oxide layer 160. The second oxide layer 160 may be formed of a material containing a lower content of hydrogen than the second barrier layer 180. The second oxide layer 160 and the first oxide layer 140 may be formed of the same material as, or different materials from, each other. The second oxide layer 160 plays a role of a channel stopper in contact with the channel, and thus preferably has a small amount of defects (e.g., dangling bonds, etc.) included in the film. The second oxide layer 160 may be formed by substantially the same method as that of the underlying layer 110.

The second barrier layer 180 may be formed of an inorganic insulating material such as SiNx, SiNxOy, SiOxNy, AlNx, AlNxOy, AlOxNy or the like. Namely, the second barrier layer 180 may be formed of a material containing nitrogen. Alternatively, the second oxide layer 160 may have a stack of films of any of such insulating materials. The second barrier layer 180 and the first barrier layer 130 may be formed of the same material as, or different materials from, each other. The second barrier layer 180 may be formed by substantially the same method as that of the underlying layer 110.

The source and drain electrodes 170 may be formed of a commonly used metal material or a commonly used conductive semiconductor material, like the gate electrode 120. For example, the source and drain electrodes 170 may be formed of Al, Ti, Cr, Co, Ni, Zn, Mo, In, Sn, Hf, Ta, W, Pt, Bi, or the like. Alternatively, the source and drain electrodes 170 may be formed of an alloy of such materials or a nitride of such materials. Still alternatively, the source and drain electrodes 170 may be formed of a conductive oxide semiconductor such as ITO, IGO, IZO, GZO or the like. The source and drain electrodes 170 may have a structure including a stack of films of any of such materials. Preferably, the material used for the source and drain electrodes 170 is resistant to a heat treatment step in a manufacturing process of a semiconductor device including a channel formed of an oxide semiconductor, and has a low contact resistance with the oxide semiconductor layer 150. As a material having a good electric contact with the oxide semiconductor layer 150, a metal material having a work function smaller than that of the oxide semiconductor layer 150 is usable for the source and drain electrodes 170.

As described above, in the semiconductor device 10 in embodiment 1 according to the present invention, the oxide semiconductor layer 150 is wrapped by the first barrier layer 130 located below the oxide semiconductor layer 150 and by the second barrier layer 180 located above the oxide semiconductor layer 150. Therefore, moisture and impurities are prevented from entering the oxide semiconductor layer 150 from above, below and sides of the oxide semiconductor layer 150. As a result, the semiconductor device 10 suppresses the characteristics thereof from varying and thus is highly reliable.

The first barrier layer 130 and the second barrier layer 180 contain nitrogen, and thus provide a high blocking characteristic against moisture and impurities. The first oxide layer 140 is located between the first barrier layer 130 and the oxide semiconductor layer 150, and the second oxide layer 160 is located between the oxide semiconductor layer 150 and the second barrier layer 180. Therefore, in the case where, for example, the first barrier layer 130 and the second barrier layer 180 are formed of a nitrogen-containing material such as SiNx or the like, the characteristics of the oxide semiconductor layer 150 are prevented from being varied by the influence of the defects and hydrogen contained in SiNx. In addition, the first oxide layer 140 is completely removed from a surface of the region of the first barrier layer 130 that is exposed from the oxide semiconductor layer 150, and this region of the first barrier layer 130 is over-etched. Therefore, the first barrier layer 130 and the second barrier layer 180 are in contact with each other with certainty. The first barrier layer 130 is over-etched, and therefore, has a stepped portion. As a result, the interface between the first barrier layer 130 and the second barrier layer 180 is bent. This prevents moisture and impurities from entering the oxide semiconductor layer 150 from the sides thereof.

[Manufacturing Method of the Semiconductor Device 10]

Figure 3:
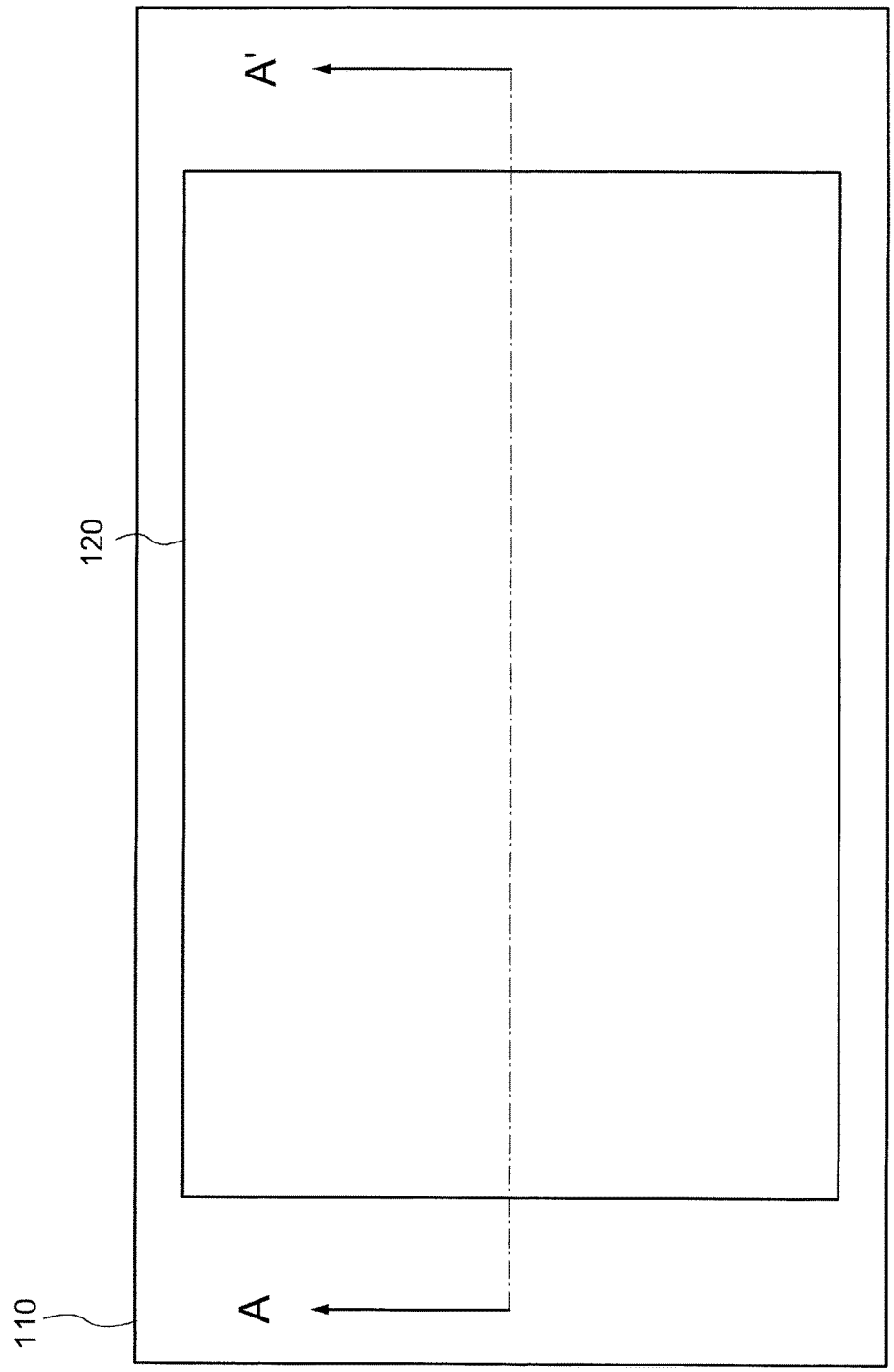
FIG. 3 is a plan view showing a step of forming a gate electrode in a manufacturing method of the semiconductor device in the embodiment according to the present invention.
Figure 4:
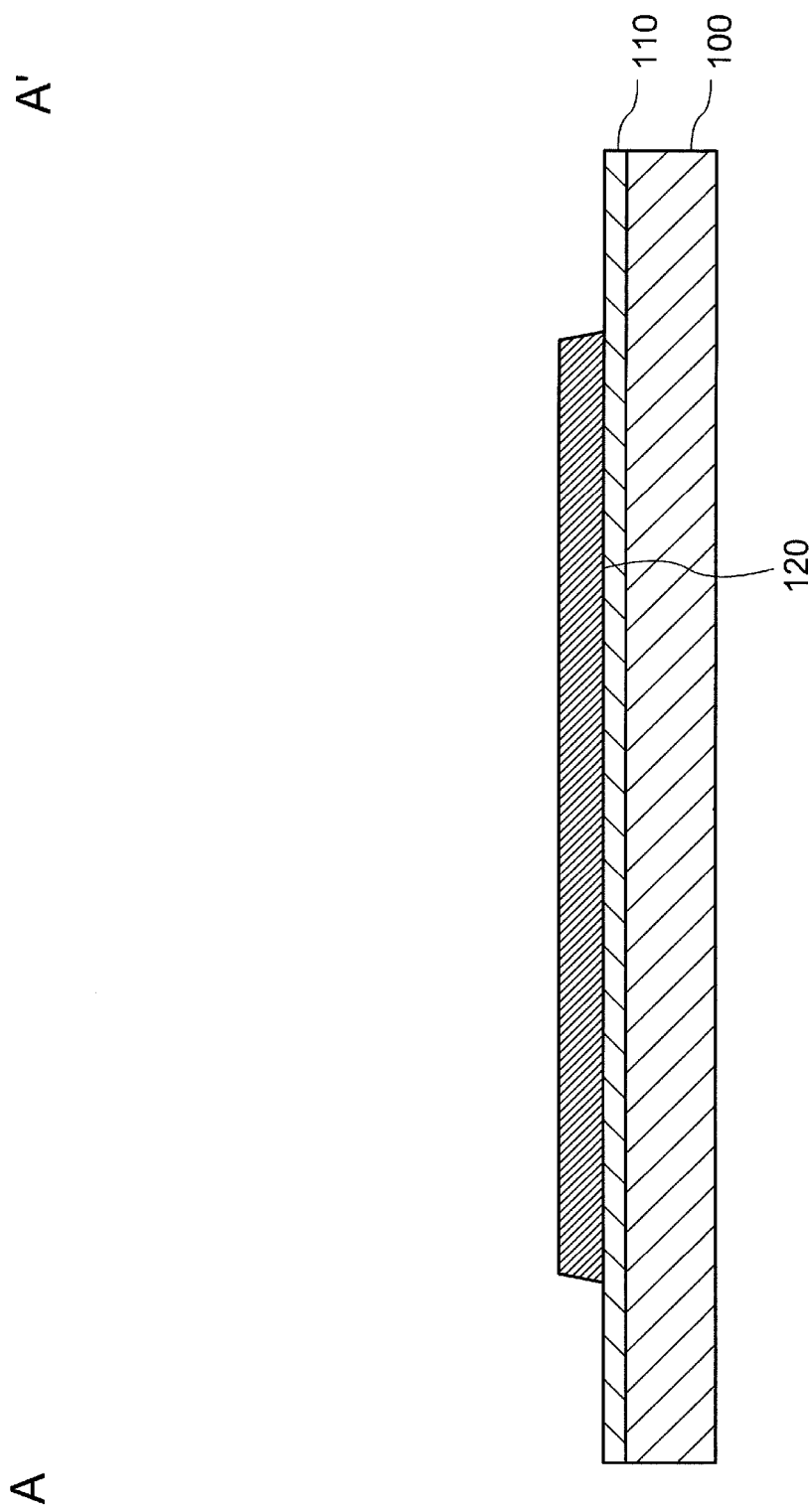
FIG. 4 is a cross-sectional view taken along line A-A' in FIG. 3 showing the step of forming the gate electrode in the manufacturing method of the semiconductor device in the embodiment according to the present invention.

With reference to FIG. 3 through FIG. 14, a manufacturing method of the semiconductor device 10 in embodiment 1 according to the present invention will be described. FIG. 3 through FIG. 14 are each a plan view of the semiconductor device 10 or a cross-sectional view of the semiconductor device 10 taken along line A-A' in the corresponding plan view. FIG. 3 and FIG. 4 are respectively a plan view and a cross-sectional view taken along line A-A' shown in FIG. 3 showing a step of forming the gate electrode 120 in the manufacturing method of the semiconductor device 10 in embodiment 1 according to the present invention. Referring to FIG. 4, the underlying layer 110 and a film for the gate electrode 120 are formed above the substrate 100, and patterning is performed by photolithography and etching to form the gate electrode 120 shown in FIG. 3. Preferably, the etching for forming the gate electrode 120 is performed under the condition that the etching rate ratio of the gate electrode 120 with respect to the underlying layer 110 is high.

Figure 5:
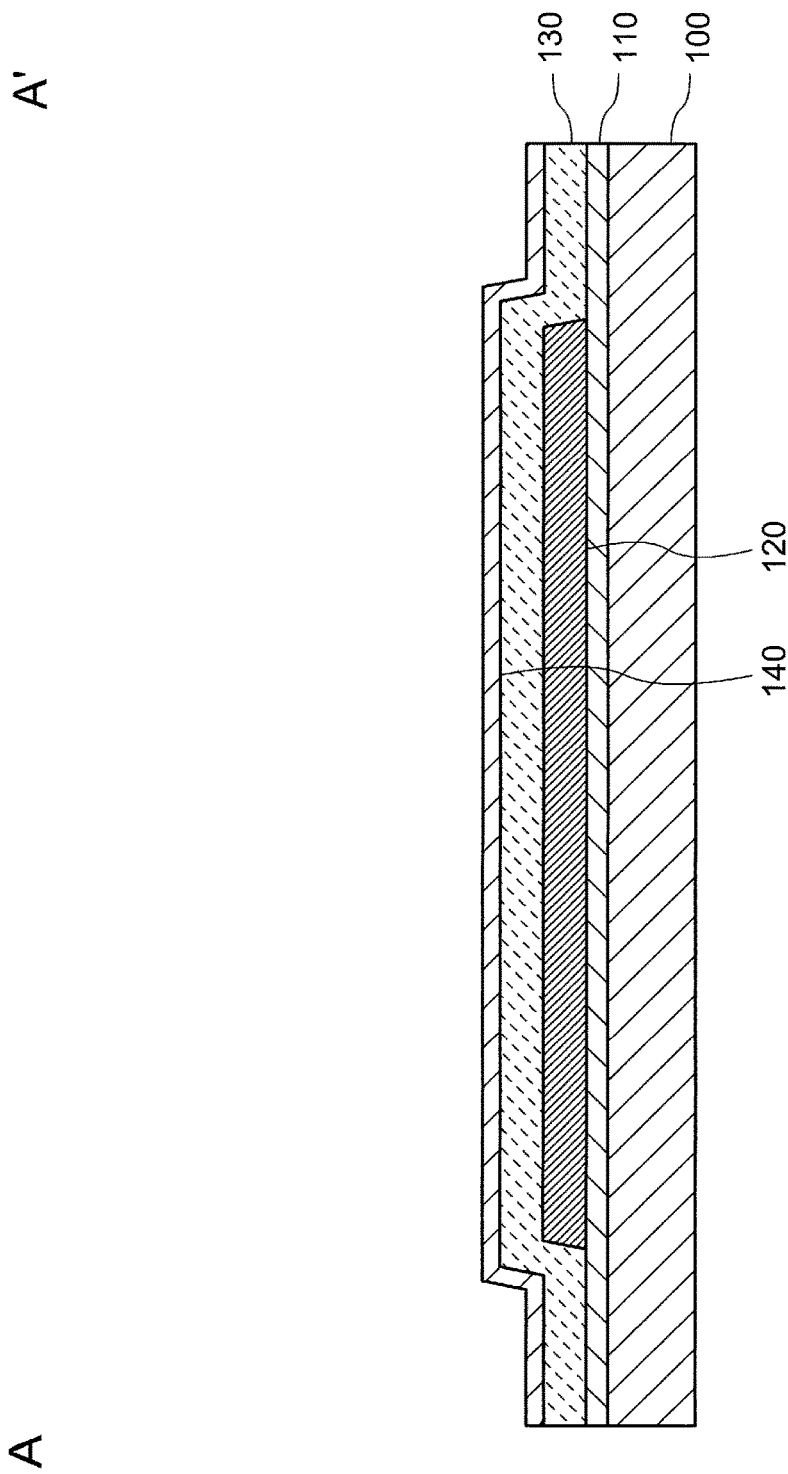
FIG. 5 is a cross-sectional view taken along line A-A' showing a step of forming a gate insulating layer in the manufacturing method of the semiconductor device in the embodiment according to the present invention.

FIG. 5 is a cross-sectional view taken along line A-A' showing a step of forming the gate insulating layer in the manufacturing method of the semiconductor device 10 in embodiment 1 according to the present invention. A plan view showing this step is substantially the same as FIG. 3, and thus will be omitted. Hereinafter, in the case where a certain plan view showing a step is substantially the same as the plan view showing a step therebefore, such a certain plan view will be omitted and only a cross-sectional view will be shown. Referring to FIG. 5, the first barrier layer 130 and a film for the first oxide layer 140 are formed above the underlying layer 110 and above the gate electrode 120. The first barrier layer 130 and the first oxide layer 140 are to act as the first gate insulating layer. As shown in FIG. 5, the first barrier layer 130 is formed above the gate electrode 120, and the film for the first oxide layer 140 is formed above the first barrier layer 130.

Figure 6:
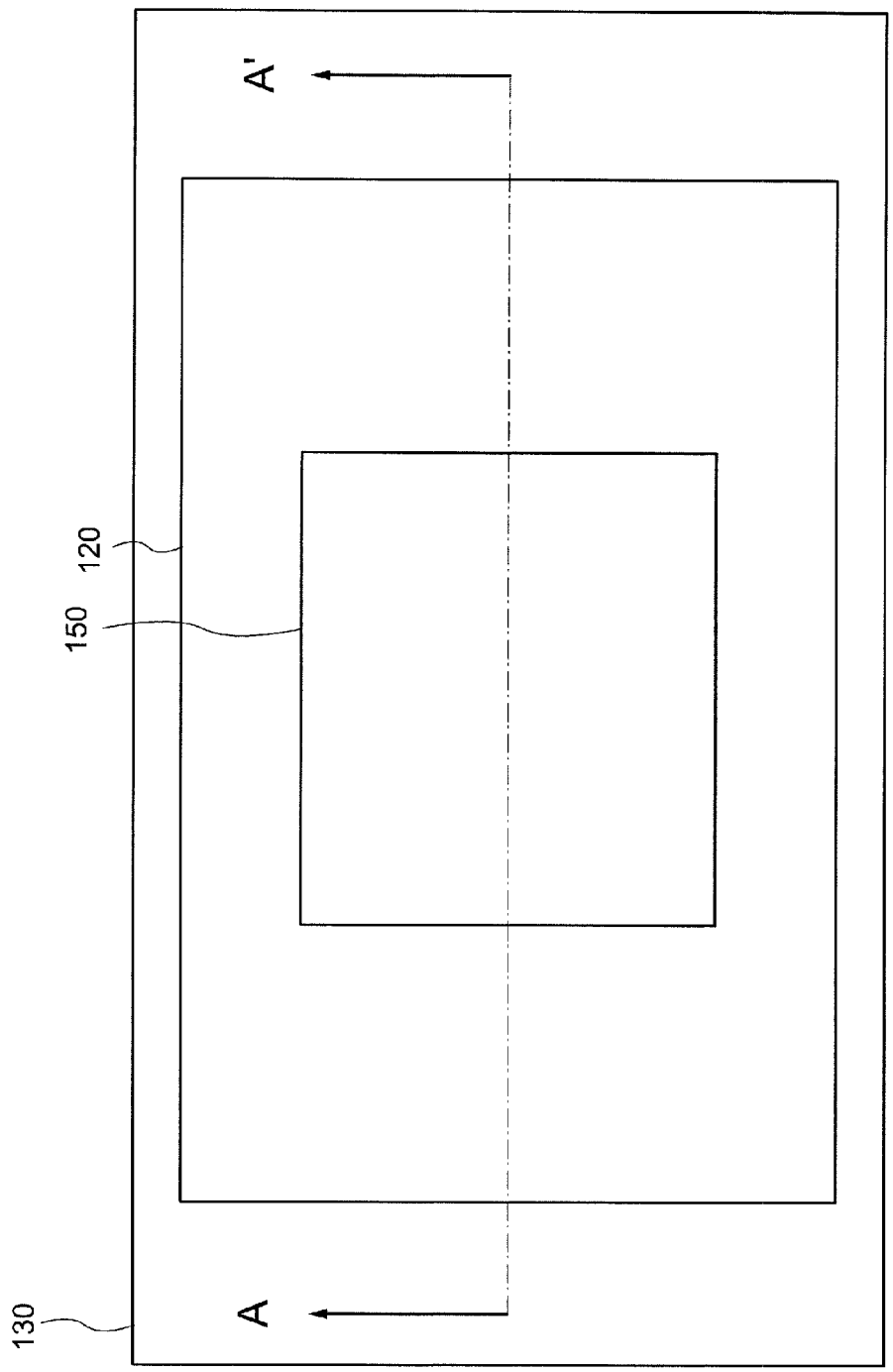
FIG. 6 is a plan view showing a step of forming an oxide semiconductor layer in the manufacturing method of the semiconductor device in the embodiment according to the present invention.
Figure 7:
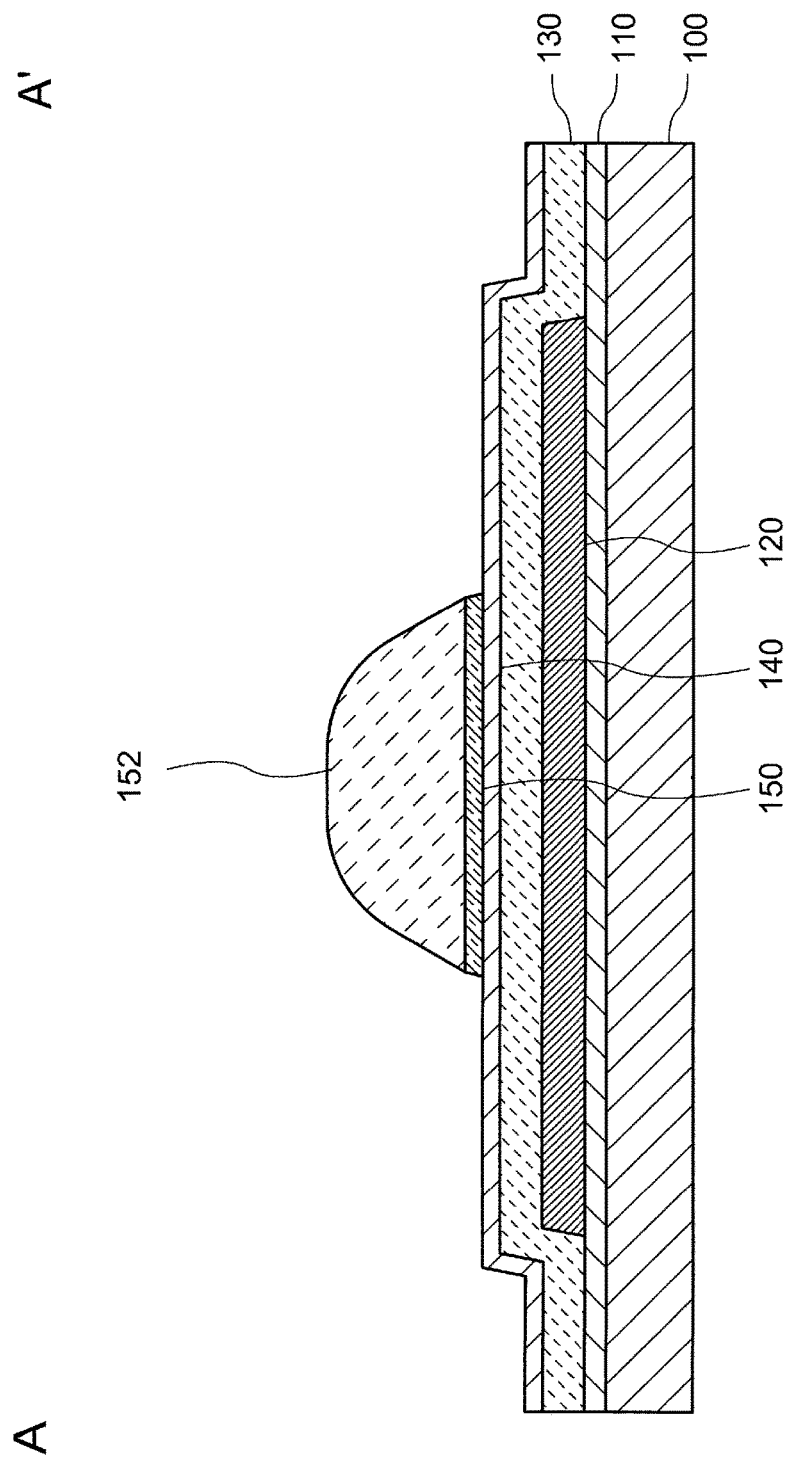
FIG. 7 is a cross-sectional view taken along line A-A' in FIG. 6 showing the step of forming the oxide semiconductor layer in the manufacturing method of the semiconductor device in the embodiment according to the present invention.

FIG. 6 and FIG. 7 are respectively a plan view and a cross-sectional view taken along line A-A' shown in FIG. 6 showing a step of forming the oxide semiconductor layer 150 in the manufacturing method of the semiconductor device 10 in embodiment 1 according to the present invention. Referring to FIG. 7, a film for the oxide semiconductor layer 150 is formed above the film for the first oxide layer 140 and is etched by use of a resist mask 152, formed by photolithography, to form the oxide semiconductor layer 150 shown in FIG. 6.

The oxide semiconductor layer 150 may be formed by sputtering. The etching for forming the oxide semiconductor layer 150 may be dry etching or wet etching. In the case where the oxide semiconductor layer 150 is formed by wet etching, an etchant containing oxalic acid, an etchant containing phosphoric acid, or an etchant containing hydrogen fluoride may be used. The etching for forming the oxide semiconductor layer 150 is performed under the condition that the etching rate ratio of the oxide semiconductor layer 150 with respect to the film for the first oxide layer 140 is high. Namely, the film for the first oxide layer 140 acts as an etching stopper for the oxide semiconductor layer 150.

Figure 8:
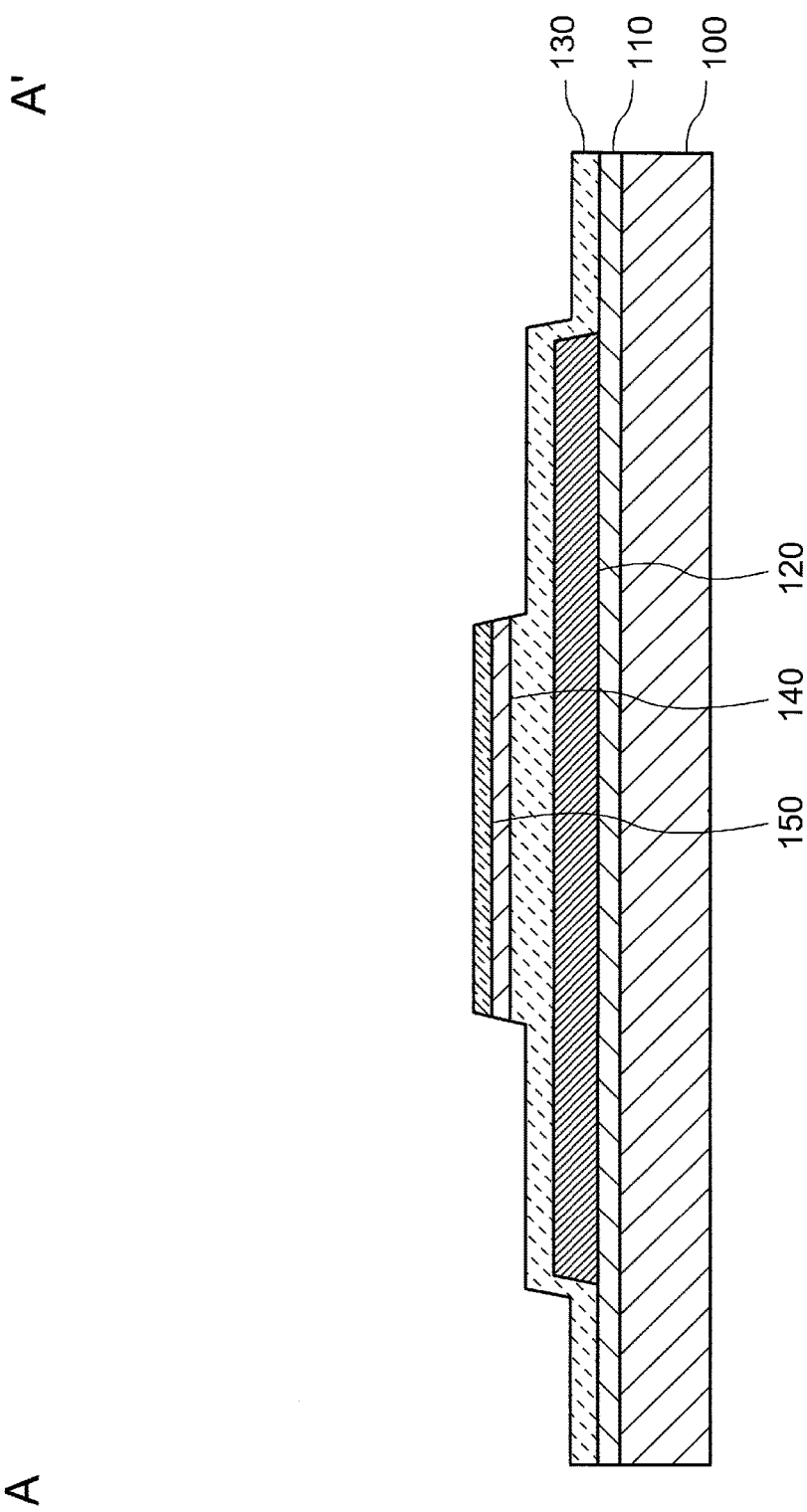
FIG. 8 is a cross-sectional view taken along line A-A' in FIG. 6 showing a step of forming a first oxide layer by etching and exposing a first barrier layer in the manufacturing method of the semiconductor device in the embodiment according to the present invention.

FIG. 8 is a cross-sectional view taken along line A-A' shown in FIG. 6 showing a step of forming the first oxide layer 140 by etching and exposing the first barrier layer 130 in the manufacturing method of the semiconductor device 10 in embodiment 1 according to the present invention. Referring to FIG. 8, the film for the first oxide layer 140 is etched by use of the oxide semiconductor layer 150, formed by patterning, as a mask to form the first oxide layer 140 and to expose the first barrier layer 130. The etching for forming the first oxide layer 140 is dry etching performed by use of fluorine-containing gas. Examples of the fluorine-containing gas usable for the dry etching include carbon tetrafluoride (CF4), trifluoromethane (CHF3), hexafluoroethane (C2F6), sulfur hexafluoride (SF6) and the like. These types of gas may be used independently or as a mixture of any thereof. For example, the dry etching may be performed by use of mixed gas of CF4 and CHF3. The dry etching may be reactive ion etching (RIE), or a plasma process performed by use of any of the above-described types of gas. The etching performed by use of fluorine-containing gas may be referred to as "fluorine etching".

With the above-described etching, the oxide semiconductor layer 150 is not etched almost at all. Therefore, the oxide semiconductor layer 150 and the first oxide layer 140 have substantially the same pattern as each other as seen in a plan view. Even in the case where the oxide semiconductor layer 150 is etched by the above-described etching, the etched amount of the oxide semiconductor layer 150 is smaller than the etched amount of the film for the first oxide layer 140 and the etched amount of the first barrier layer 130. Therefore, the oxide semiconductor layer 150 and the first oxide layer 140 have substantially the same pattern as each other as seen in a plan view.

In the step shown in FIG. 8, the region of the first barrier layer 130 that is exposed by the dry etching is half-etched (or dry-etched) in order to suppress the film for the first oxide layer 140 from unnecessarily remaining on the first barrier layer 130. Namely, the film for the first oxide layer 140 is etched such that the region of the first barrier layer 130 that is exposed from the first oxide layer 140 is thinner than the region of the first barrier layer 130 that is below the first oxide layer 140.

In the above, the resist mask 152 is removed, and the oxide semiconductor layer 150 formed by patterning is used as a mask to form the first oxide layer 140 by etching. The method for forming the first oxide layer 140 by etching is not limited to this. For example, the first oxide layer 140 may be formed by etching by use of the resist mask 152. In this case, the oxide semiconductor layer 150 and the first oxide layer 140 may be formed in the same etching step. Alternatively, the film for the oxide semiconductor layer 150 may be etched by wet etching to a position inner to an end of the resist mask 152, and the film for the first oxide layer 140 may be etched by use of the resist mask 152. In this case, the pattern of the oxide semiconductor layer 150 is inner to the pattern of the first oxide layer 140 as seen in a plan view.

Figure 9:
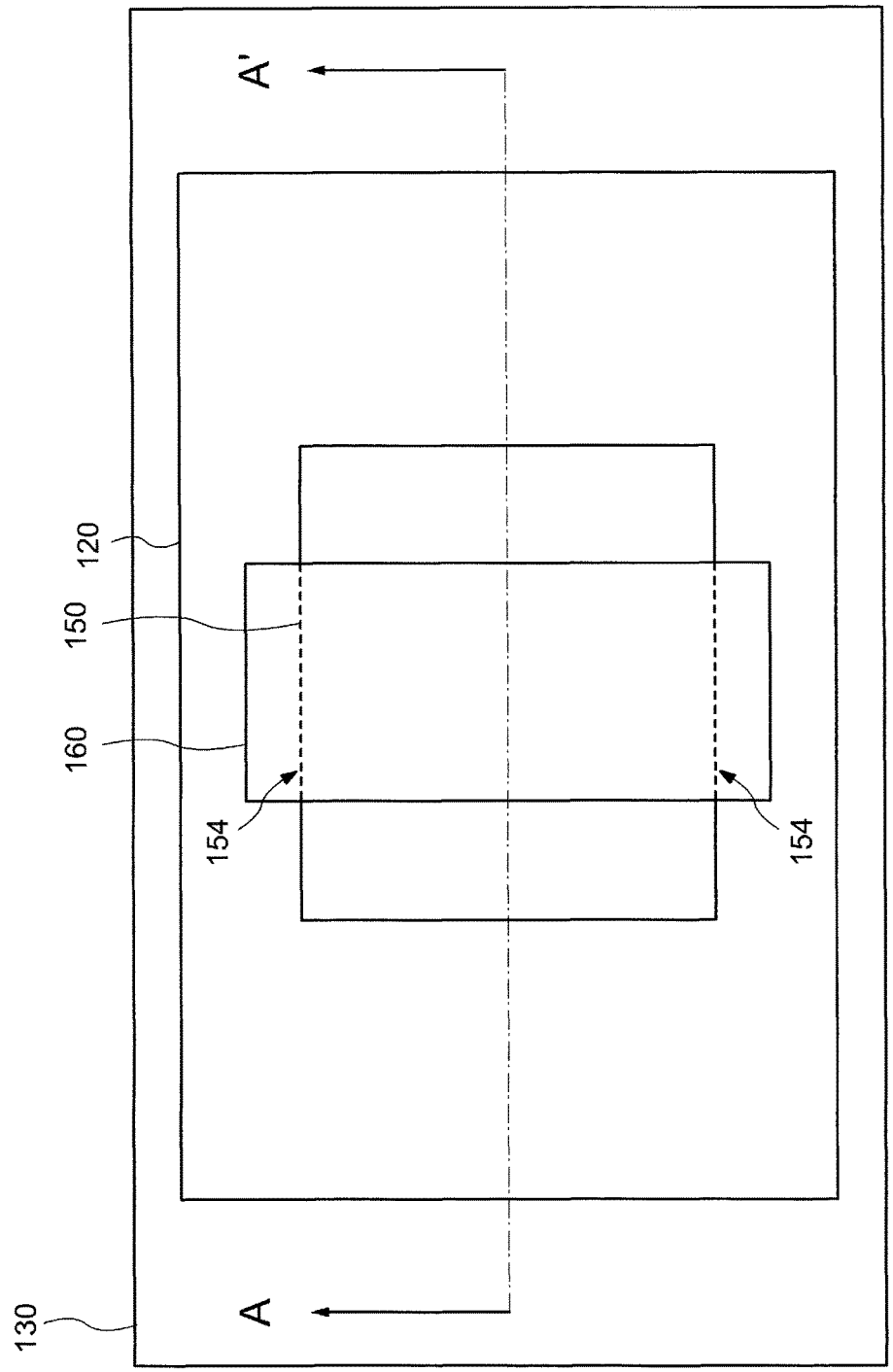
FIG. 9 is a plan view showing a step of forming a second oxide layer in the manufacturing method of the semiconductor device in the embodiment according to the present invention.
Figure 10:
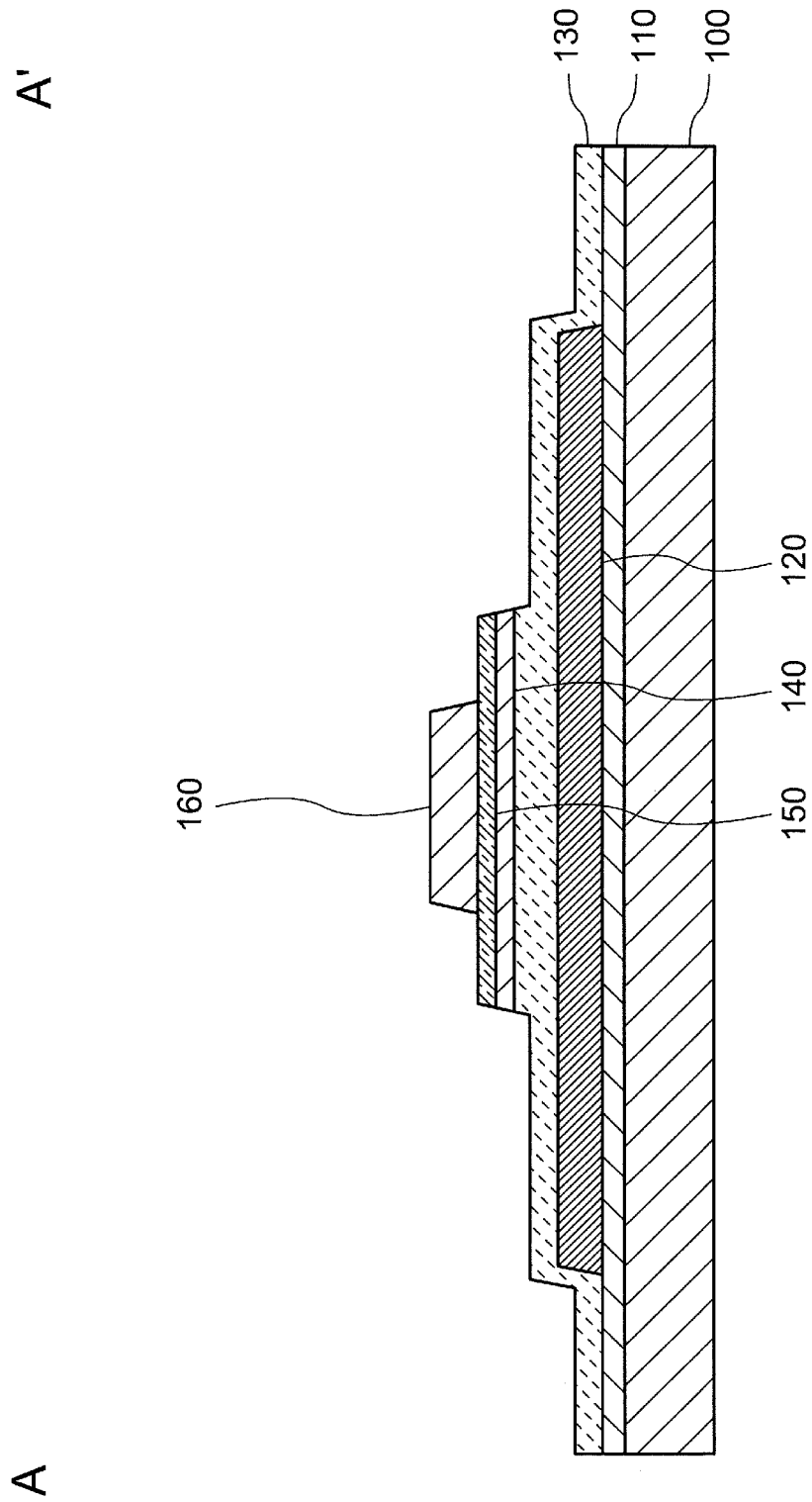
FIG. 10 is a cross-sectional view taken along line A-A' in FIG. 9 showing the step of forming the second oxide layer in the manufacturing method of the semiconductor device in the embodiment according to the present invention.

FIG. 9 and FIG. 10 are respectively a plan view and a cross-sectional view taken along line A-A' shown in FIG. 9 showing a step of forming the second semiconductor layer 160 in the manufacturing method of the semiconductor device 10 in embodiment 1 according to the present invention. Referring to FIG. 10, a film for the second semiconductor layer 160 is formed above the oxide semiconductor layer 150, and is patterned by photolithography and etching to form the second oxide layer 160 partially exposing the oxide semiconductor layer 150 as shown in FIG. 9.

The second oxide layer 160 covers the region of the oxide semiconductor layer 150 that is to be the channel, and exposes a source region and a drain region of the oxide semiconductor layer 150. As shown in FIG. 9, the second oxide layer 160 is formed to cover ends 154 of the oxide semiconductor layer 150. The ends 154 of the oxide semiconductor layer 150, which are influenced by etching or the like to easily have properties thereof fluctuate, are protected by the second oxide layer 160. Therefore, the characteristics of the semiconductor device 10 are suppressed from fluctuating.

Figure 11:
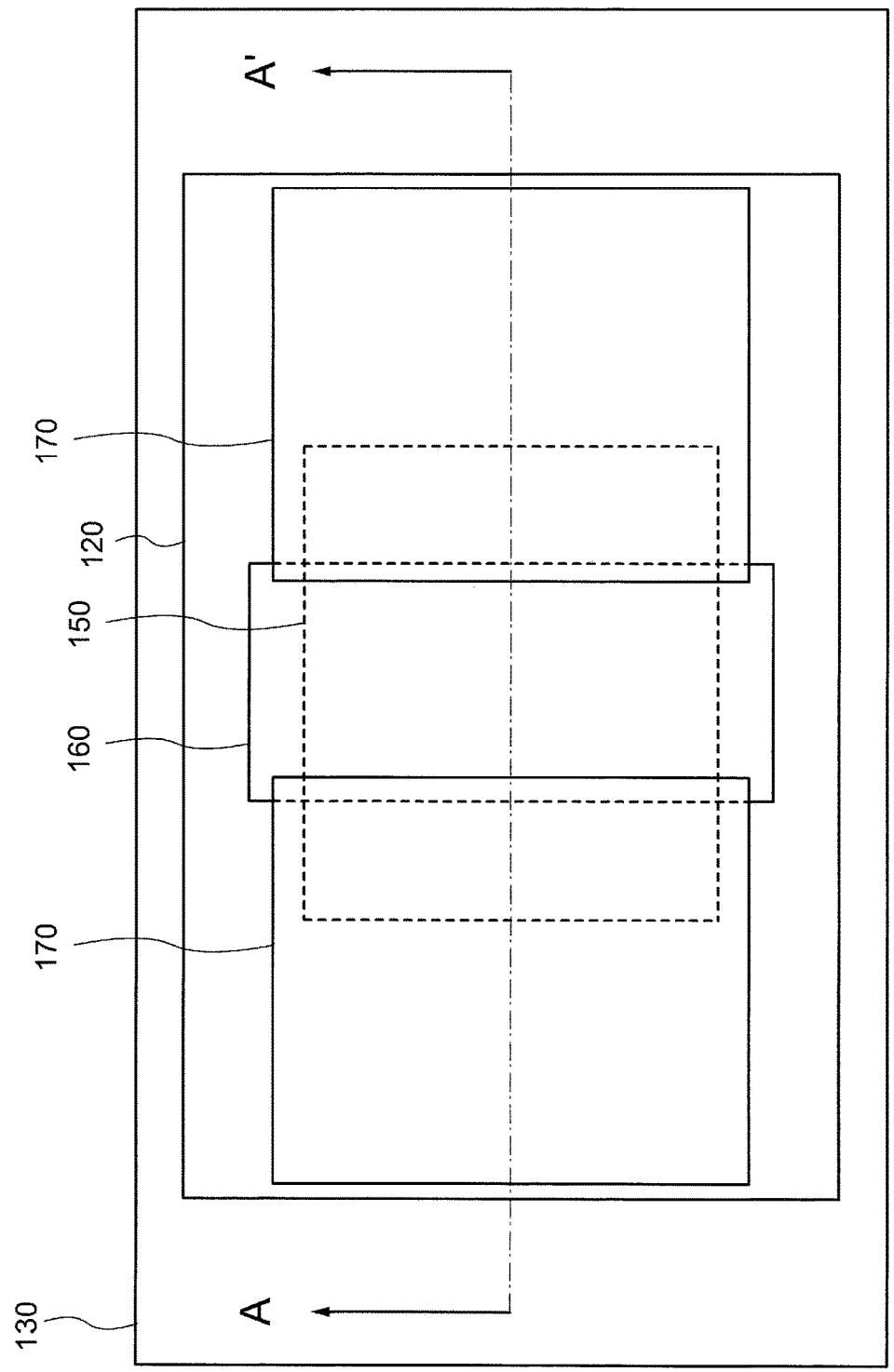
FIG. 11 is a plan view showing a step of forming a source electrode and a drain electrode in the manufacturing method of the semiconductor device in the embodiment according to the present invention.
Figure 12:
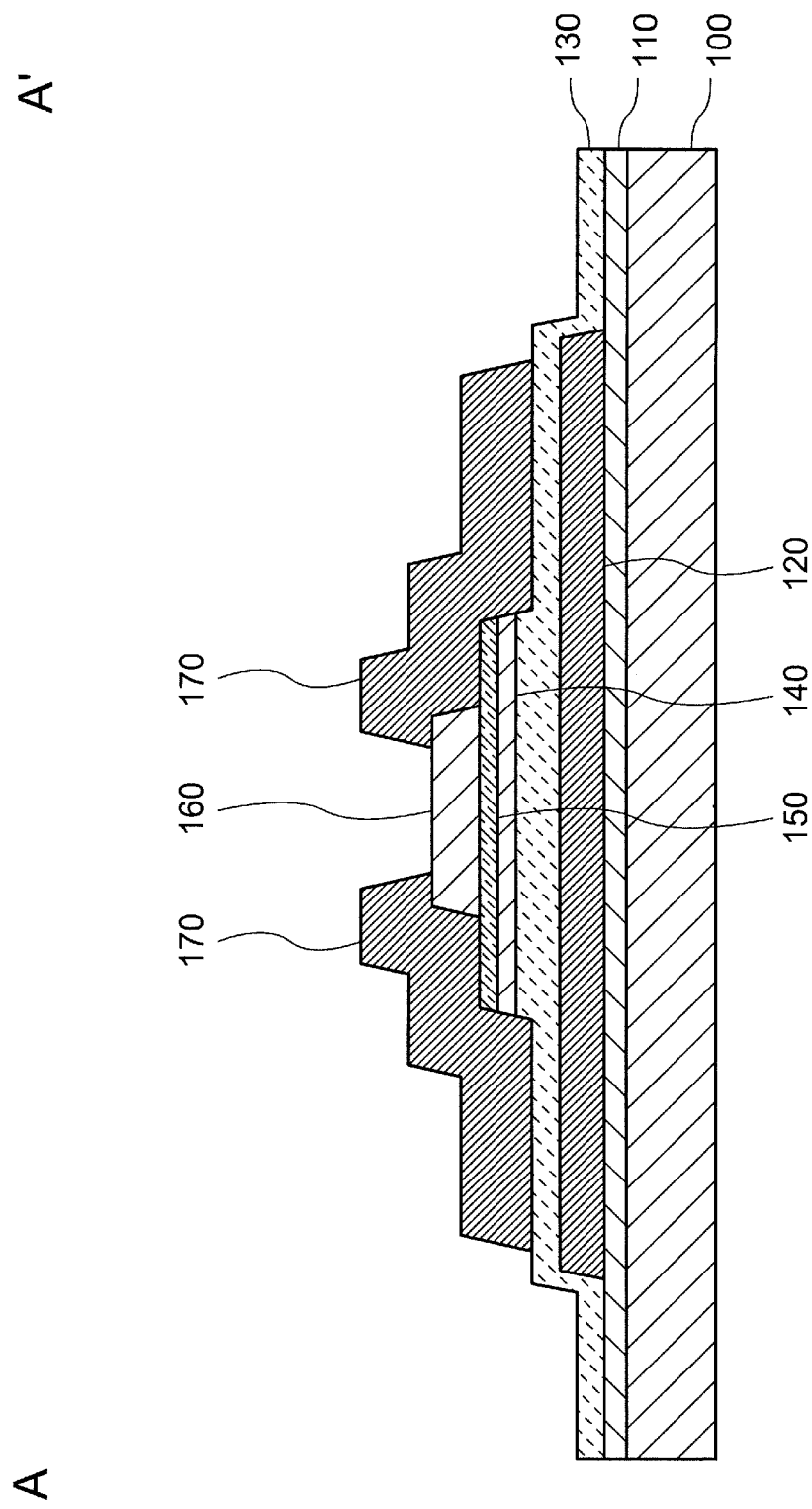
FIG. 12 is a cross-sectional view taken along line A-A' in FIG. 11 showing the step of forming the source electrode and the drain electrode in the manufacturing method of the semiconductor device in the embodiment according to the present invention.

FIG. 11 and FIG. 12 are respectively a plan view and a cross-sectional view taken along line A-A' shown in FIG. 11 showing a step of forming the source and drain electrodes 170 in the manufacturing method of the semiconductor device 10 in embodiment 1 according to the present invention. Referring to FIG. 12, a conductive film for the source and drain electrodes 170 is formed above the second oxide layer 160, above the oxide semiconductor layer 150 and above the first barrier layer 130, and is patterned by photolithography and etching to form the source and drain electrodes 170 as shown in FIG. 11. The second oxide layer 160 acts as an etching stopper for the source and drain electrodes 170, and protects the second oxide semiconductor layer 150. As shown in FIG. 11, regions of the oxide semiconductor layer 150 that are exposed from the second oxide layer 160 are covered with the source and drain electrodes 170.

Figure 13:
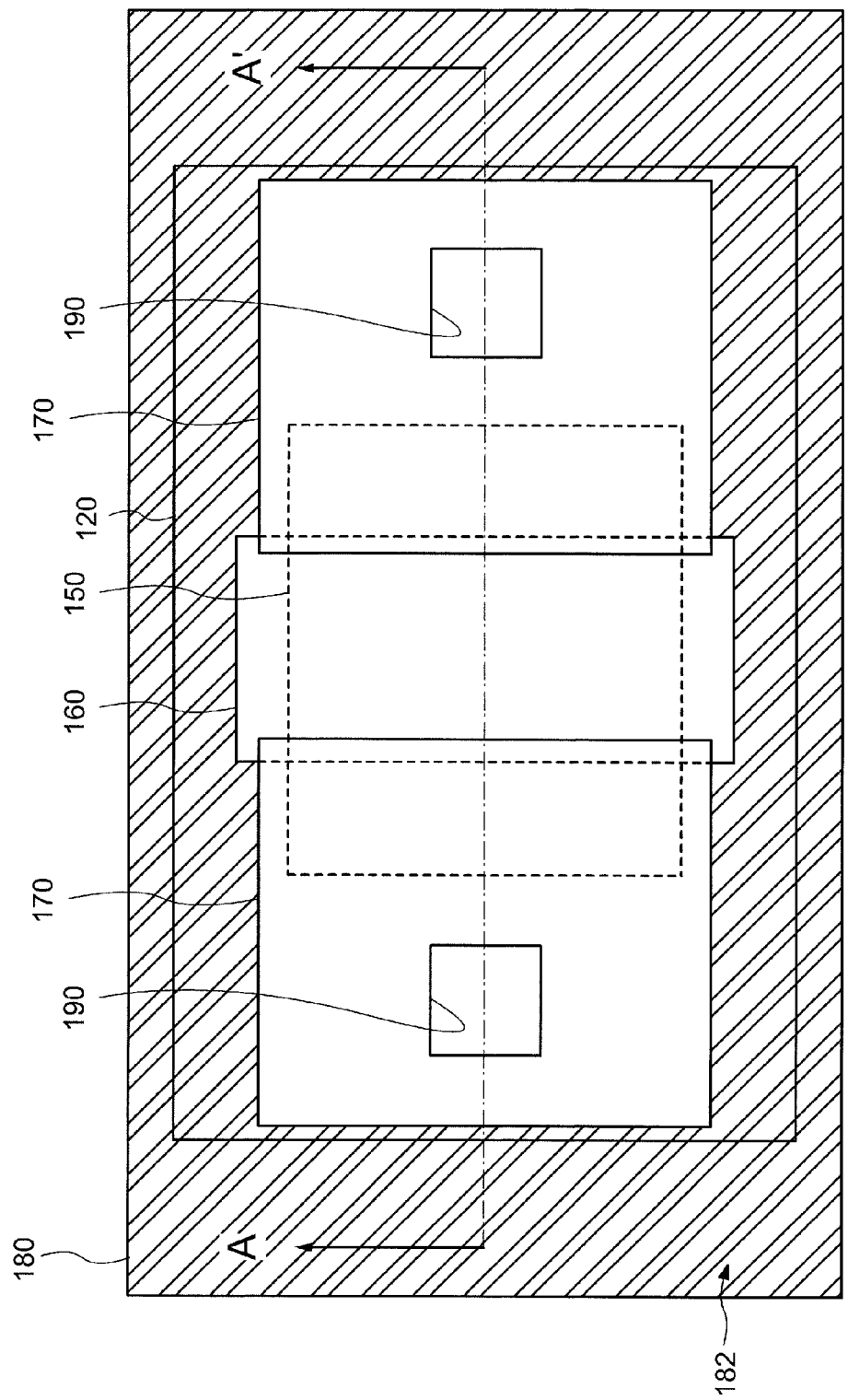
FIG. 13 is a plan view showing a step of forming a second barrier layer in the manufacturing method of the semiconductor device in the embodiment according to the present invention.
Figure 14:
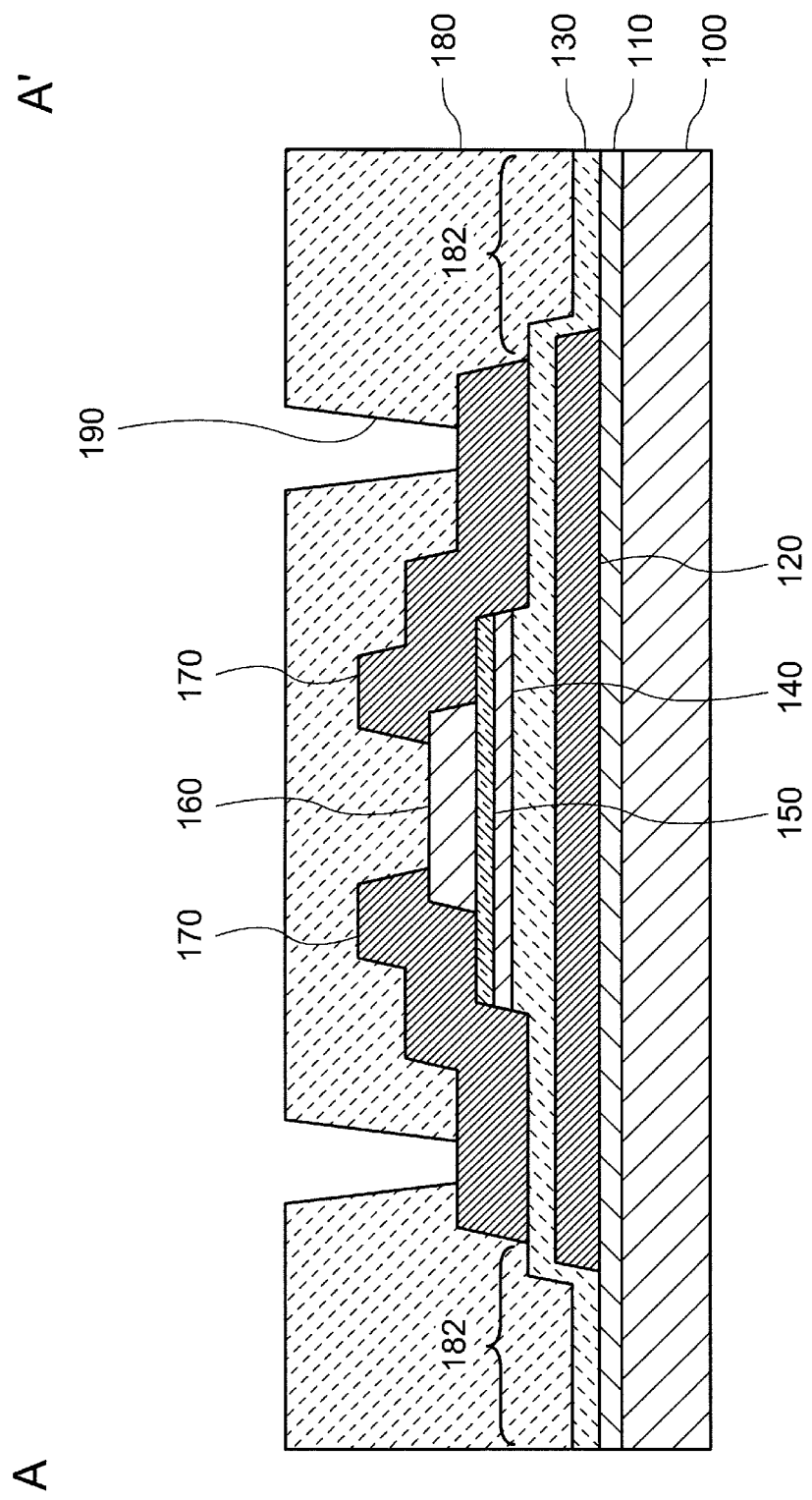
FIG. 14 is a cross-sectional view taken along line A-A' in FIG. 13 showing the step of forming the second barrier layer in the manufacturing method of the semiconductor device in the embodiment according to the present invention.

FIG. 13 and FIG. 14 are respectively a plan view and a cross-sectional view taken along line A-A' shown in FIG. 13 showing a step of forming the second barrier layer 180 in the manufacturing method of the semiconductor device 10 in embodiment 1 according to the present invention. Referring to FIG. 14, the second barrier layer 180 is formed above the source and drain electrodes 170, above the second oxide layer 160 and above the first barrier layer 130, and the openings 190 are formed in the second barrier layer 180 by photolithography and etching as shown in FIG. 13 and FIG. 14. As shown in FIG. 14, the first barrier layer 130 and the second barrier layer 180 are in contact with each other in the barrier layer contact region 182, which is represented by inclining lines in FIG. 13. As shown in FIG. 13, the barrier layer contact region 182 surrounds the oxide semiconductor layer 150.

Then, a film for the upper wiring line 200 is formed on the substrate shown in FIG. 13 and FIG. 14, and the upper wiring line 200 is formed by photolithography and etching as shown in FIG. 1, FIG. 2A and FIG. 2B. The semiconductor device 10 in embodiment 1 according to the present invention is manufactured by the manufacturing method described above. In this and the following descriptions of manufacturing methods of semiconductor devices in embodiments according to the present invention, an assembly of the substrate 100 (or 100A) and the layer(s) formed thereon may be referred to as the "substrate" for the sake of convenience.

In the manufacturing method of the semiconductor device 10 in embodiment 1 according to the present invention described above, the first oxide layer 140 is formed by dry etching by use of fluorine-containing gas. Therefore, the oxide semiconductor layer 150, even though being exposed, are suppressed from being etched, and the oxide semiconductor layer 150 exposed to the fluorine-containing gas is suppressed from being damaged. This allows the first oxide layer 140 to be formed by etching by use of the oxide semiconductor layer 150 as a mask. As a result, the pattern of the oxide semiconductor layer 150 is reflected on the pattern of the first oxide layer 140. Ends of the pattern of the oxide semiconductor layer 150 and ends of the pattern of the first oxide layer 140 are made continuous to each other as seen in a cross-sectional view. This suppresses the problem that, for example, the layer(s) formed thereon is(are) discontinued.

<Modification of Embodiment 1>

Figure 15:
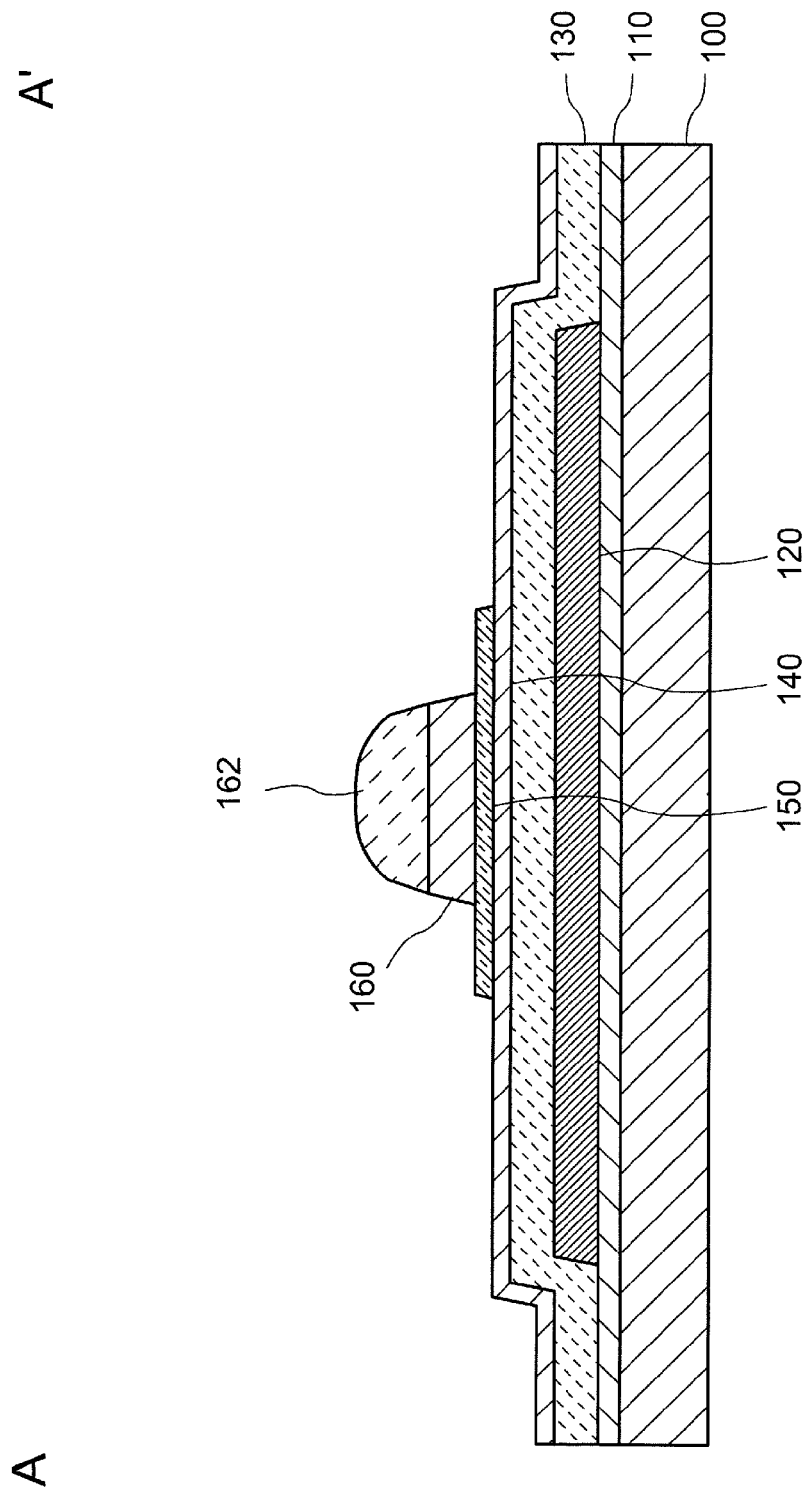
FIG. 15 is a cross-sectional view taken along line A-A' showing a step of forming a second oxide layer in a manufacturing method of a semiconductor device in a modification of the embodiment according to the present invention.
Figure 16:
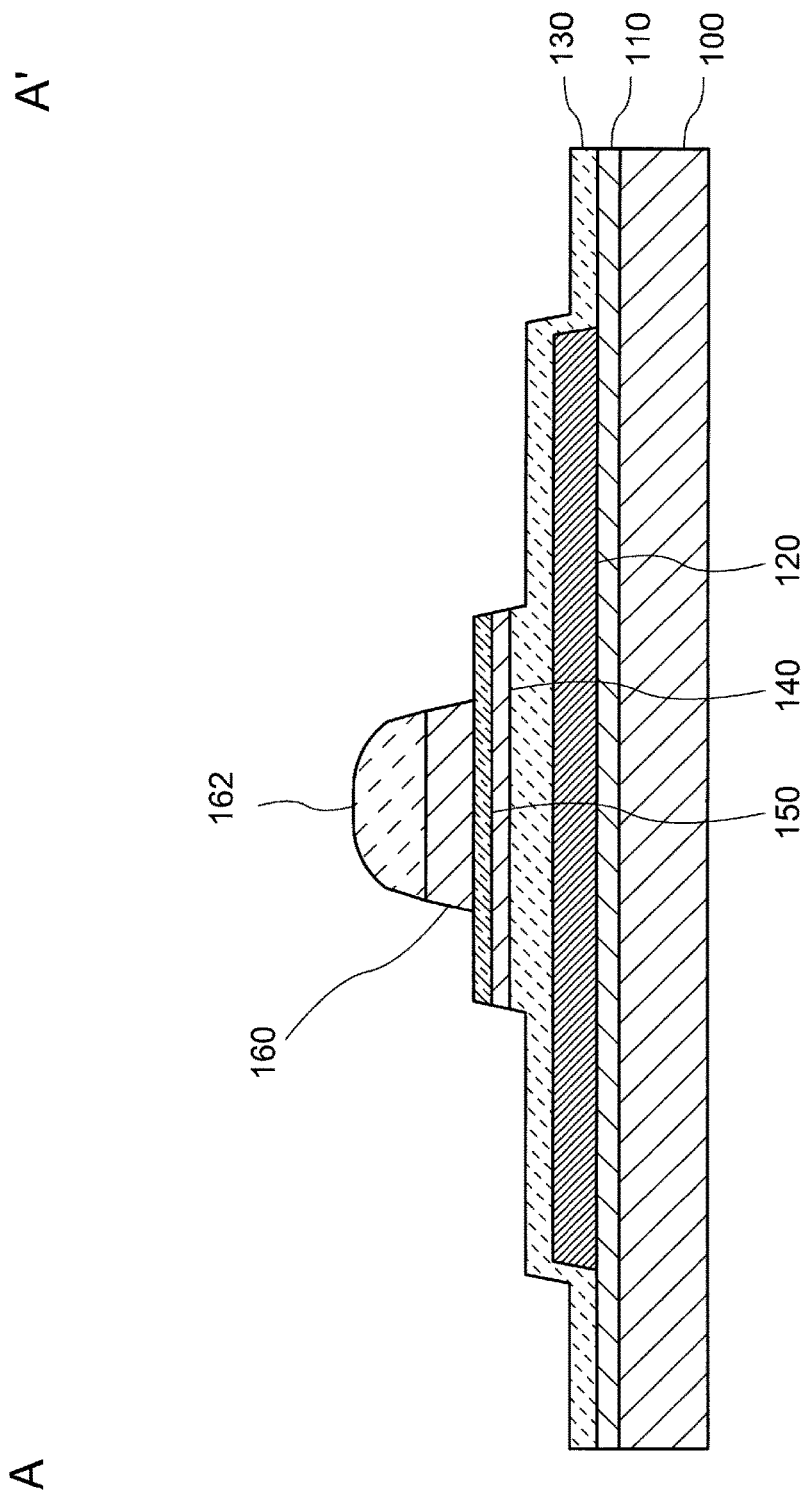
FIG. 16 is a cross-sectional view taken along line A-A' showing a step of forming a first oxide layer by etching and exposing the first barrier layer in the manufacturing method of the semiconductor device in the modification of the embodiment according to the present invention.

With reference to FIG. 15 and FIG. 16, a modification of embodiment 1 according to the present invention will be described. A manufacturing method of a semiconductor device in the modification of embodiment 1 is similar to the manufacturing method of the semiconductor device 10 in embodiment 1. In the following description, components that have the same structure and the function as those of the semiconductor device 10 bear the identical reference signs thereto, and detailed descriptions thereof may be omitted. In the modification of embodiment 1, the manufacturing method up to the step of forming the oxide semiconductor layer 150 is substantially the same as that of the semiconductor device 10 in embodiment 1 described with reference to FIG. 3 through FIG. 7, and thus will not be described.

FIG. 15 is a cross-sectional view taken along line A-A' showing a step of forming the second oxide layer 160 in the manufacturing method of the semiconductor device in the modification of embodiment 1 according to the present invention. In embodiment 1 (see FIG. 10), the first barrier layer 130 is exposed and then the second oxide layer 160 is formed. In the modification of embodiment 1, the second oxide layer 160 is formed before the first barrier layer 130 is exposed, namely, before the film for the first oxide layer 140 is etched to form the first oxide layer 140. Specifically, after the oxide semiconductor layer 150 is formed by patterning but before the first barrier layer 130 is exposed, the film for the second oxide layer 160 is formed above the oxide semiconductor layer 150. Then, the film for the second oxide layer 160 is etched by use of a resist mask 162 formed above the film for the second oxide layer 160, such that the second oxide layer 160 covers the region of the oxide semiconductor layer 150 that is to be a channel. The etching for forming the second oxide layer 160 may be dry etching performed by use of fluorine-containing gas.

FIG. 16 is a cross-sectional view taken along line A-A' showing a step of forming the first oxide layer 140 by etching and exposing the first barrier layer 130 in the manufacturing method of the semiconductor device in the modification of embodiment 1 according to the present invention. The first oxide layer 140 is formed by etching and the first barrier layer 130 is over-etched and thus exposed by the same etching step as for forming the second oxide layer 160. Then, the resist mask 162 is removed to provide the substrate in the same state as that shown in FIG. 10. The manufacturing method of the semiconductor device in the modification of embodiment 1 after this step is the substantially the same as that of the semiconductor device 10 in embodiment 1, and thus will not be described.

As described above, in the manufacturing method of the semiconductor device in the modification of embodiment 1 according to the present invention, one etching step exposes the first barrier layer 130 and also forms the second oxide layer 160. Namely, the manufacturing method is shortened.

Embodiment 2

Figure 18A:
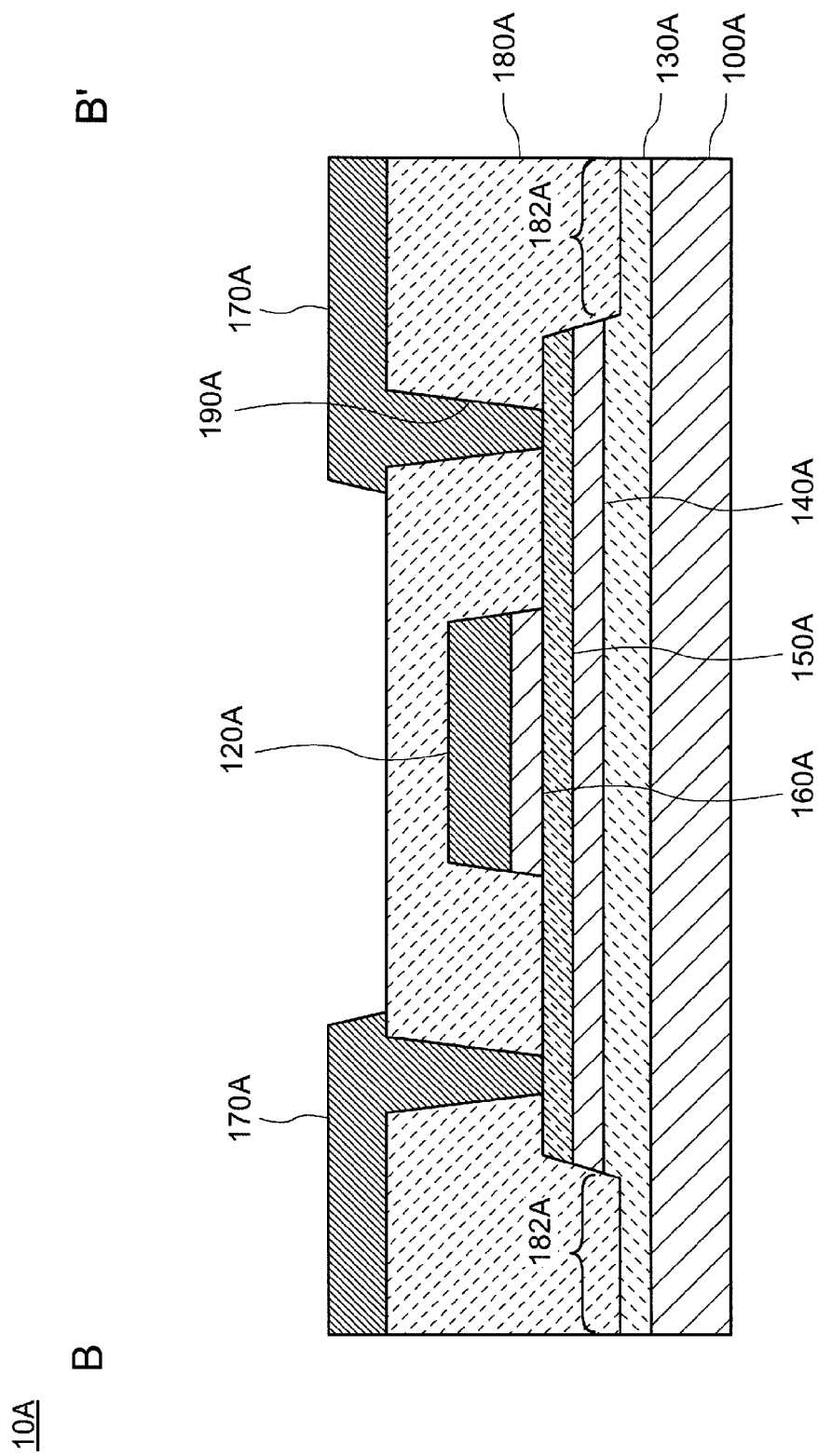
FIG. 18A is a cross-sectional view showing an overview of the semiconductor device in the embodiment according to the present invention, taken along line B-B' in FIG. 17.
Figure 18B:
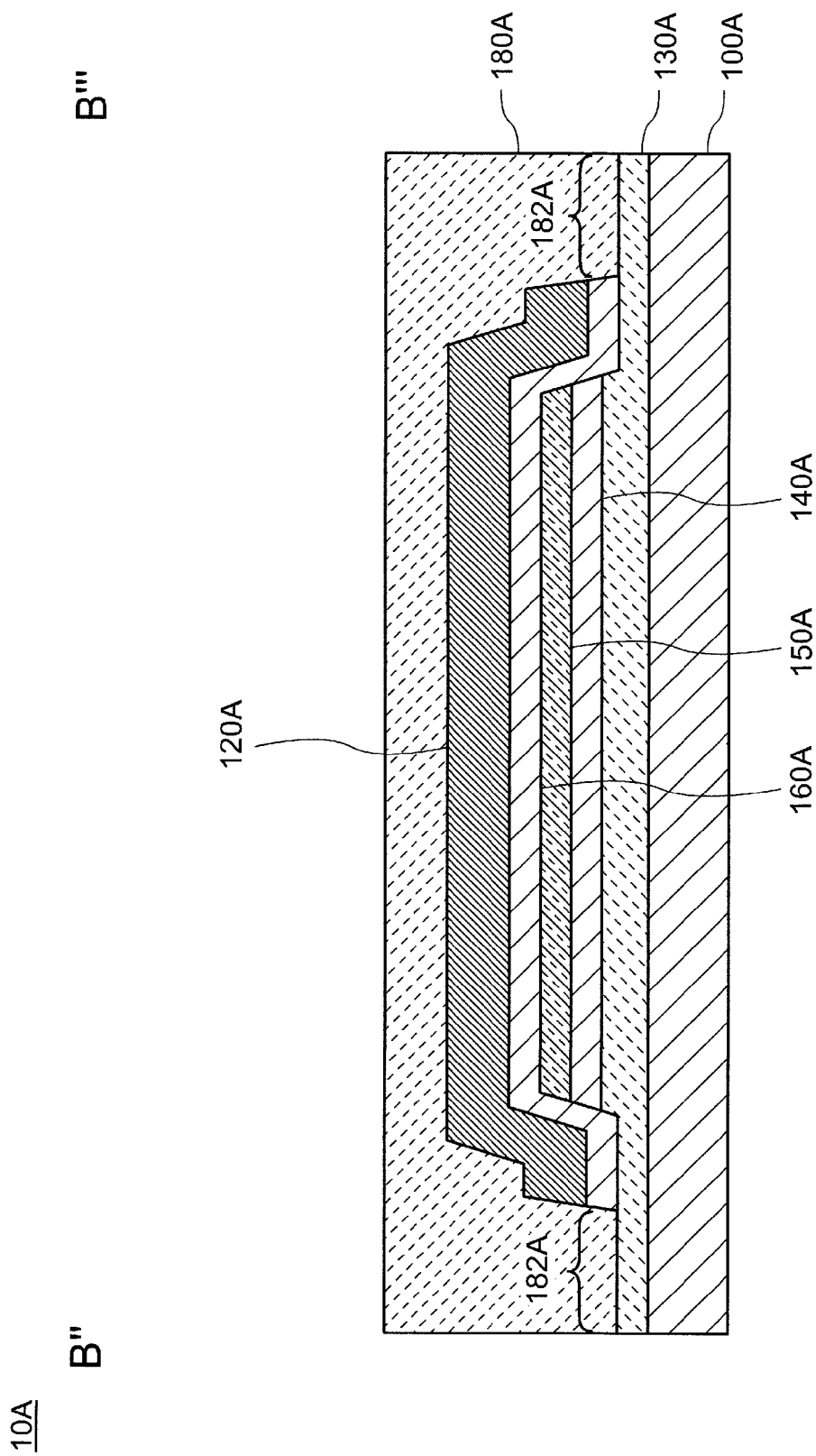
FIG. 18B is a cross-sectional view showing an overview of the semiconductor device in the embodiment according to the present invention, taken along line B"-B" in FIG. 17.

With reference to FIGS. 17, 18A and 18B, an overview of a semiconductor device 10A in embodiment 2 according to the present invention will be described. The semiconductor device 10A in embodiment 2 is usable in a pixel or a driving circuit of an LCD, a spontaneous emission display device using an OLED for a display unit, or a reflection-type display device such as an electronic paper or the like.

[Structure of the Semiconductor Device 10A]

FIG. 17 is a plan view showing an overview of the semiconductor device 10A in embodiment 2 according to the present invention. FIG. 18A is a cross-sectional view showing an overview of the semiconductor device 10A in embodiment 2 according to the present invention, taken along line B-B' in FIG. 17. FIG. 18B is a cross-sectional view showing an overview of the semiconductor device 10A in embodiment 2 according to the present invention, taken along line B"-B" in FIG. 17. As shown in FIG. 17, FIG. 18A and FIG. 18B, the semiconductor device 10A includes a substrate 100A, an underlying layer (a first barrier layer 130A and a first oxide layer 140A), an oxide semiconductor layer 150A, a gate insulating layer (a second oxide layer 160A), a gate electrode 120A, a second barrier layer 180A, and source and drain electrodes 170A. The semiconductor device 10A is a top gate-type transistor.

The first barrier layer 130A is located above the substrate 100A. The first oxide layer 140A is located above the first barrier layer 130A. The oxide semiconductor layer 150A is located above the first oxide layer 140A. The oxide semiconductor layer 150A is in contact with the first oxide layer 140A. The first oxide layer 140A is located only below the oxide semiconductor layer 150A, and is removed from a region other than a region below the oxide semiconductor layer 150. Namely, the first oxide layer 140A has substantially the same pattern as that of the oxide semiconductor layer 150A as seen in a plan view. A region of the first barrier layer 130A that is exposed from the first oxide layer 140A is thinner than a region of the first barrier layer 130A that is below the first oxide layer 140A. Namely, the first oxide layer 140A is completely removed from the region other than the region below the oxide semiconductor layer 150A, and the region of the first barrier layer 130A that is exposed from the first oxide layer 140A is over-etched.

As shown in FIG. 18A, the second oxide layer 160A is located above, and in contact with, the oxide semiconductor layer 150A. The gate electrode 120A is located above the second oxide layer 160A. As shown in FIG. 18B, the second oxide layer 160A covers a top surface and side surfaces of the oxide semiconductor layer 150A. The gate electrode 120A is located along the second oxide layer 160A. Namely, the second oxide layer 160A acts as the gate insulating layer. The gate insulating layer is not limited to being formed of a single layer of the second oxide layer 160A, and may include another insulating layer. In other words, the gate insulating layer may be described as including the second oxide layer 160A. In the semiconductor device 10A, a region of the oxide semiconductor layer 150A that faces the gate electrode 120A acts as a channel.

The second barrier layer 180A is located above the gate electrode 120A, above the oxide semiconductor layer 150A and above the region of the first barrier layer 130A that is exposed from the first oxide layer 140A. In other words, the second barrier layer 180A is located above the oxide semiconductor layer 150A, and covers the top surface and the side surfaces of the oxide semiconductor layer 150. The second barrier layer 180A is in contact with the first barrier layer 130A in a barrier layer contact region 182A outer to the first oxide layer 140A. The barrier layer contact region 182A is located around the oxide semiconductor layer 150A. In other words, the oxide semiconductor layer 150A may be described as being wrapped by the first barrier layer 130A and the second barrier layer 180A.

The second barrier layer 180A is in contact with a region of the oxide semiconductor layer 150A that is not the channel region, namely, a source region and a drain region exposed from the second oxide layer 160A. In the case where, for example, the second barrier layer 180A is formed of a nitrogen-containing material such as SiNx or the like, the oxide semiconductor layer 150A has a resistivity thereof decreased by the influence of the defects and hydrogen contained in SiNx. Namely, the region of the oxide semiconductor layer 150A that is exposed from the second oxide layer 160A has a resistivity lower than that of the region of the oxide semiconductor layer 150A that is below the second oxide layer 160A (namely, the channel region).

The second barrier layer 180A has openings 190A formed therein, the openings 190A partially exposing the oxide semiconductor layer 150A. The above-described structure may be expressed as follows. The second oxide layer 160A may be described as being located between the oxide semiconductor layer 150A and the second barrier layer 180A. The gate electrode 120A may be described as being located between the second oxide layer 160A and the second barrier layer 180A. The openings 190A may be described as reaching the source region and the drain region of the oxide semiconductor layer 150A.

The source and drain electrodes 170A are located in the openings 190A, and are connected with the oxide semiconductor layer 150A via the openings 190A. The source and drain electrodes 170A are a pair of electrodes separated from each other while having a distance therebetween. In accordance with the applied voltage, one of the pair of electrodes is the source electrode and the other is the drain electrode. In other words, the source and drain electrodes 170A are connected with the source region and the drain region of the oxide semiconductor layer 150A.

The substrate 100A, the first barrier layer 130A, the first oxide layer 140A, the oxide semiconductor layer 150A, the second oxide layer 160A, the gate electrode 120A, the second barrier layer 180A, and the source and drain electrodes 170A may be formed of substantially the same materials as those of the semiconductor device 10 in embodiment 1.

As described above, in the semiconductor device 10A in embodiment 2 according to the present invention, the oxide semiconductor layer 150A is wrapped by the first barrier layer 130A located below the oxide semiconductor layer 150A and by the second barrier layer 180A located above the oxide semiconductor layer 150A. Therefore, moisture and impurities are prevented from entering the oxide semiconductor layer 150A from above, below and sides of the oxide semiconductor layer 150A. As a result, the semiconductor device 10A suppresses the characteristics thereof from varying and thus is highly reliable.

In addition, the second barrier layer 180A containing nitrogen is in contact with the region of the oxide semiconductor layer 150A that is exposed from the second oxide layer 160A. This decreases a resistivity of the oxide semiconductor layer 150A in regions that correspond to the source region and the drain region of the semiconductor device 10A. As a result, the on-current of the semiconductor device 10A is increased. The first oxide layer 140A is completely removed from a surface of the region of the first barrier layer 130A that is exposed from the oxide semiconductor layer 150A, and this region of the first barrier layer 130A is over-etched. Therefore, the first barrier layer 130A and the second barrier layer 180A are in contact with each other with certainty. The first barrier layer 130A is over-etched, and therefore, has a stepped portion. As a result, the interface between the first barrier layer 130A and the second barrier layer 180A is bent. This prevents moisture and impurities from entering the oxide semiconductor layer 150A from the sides thereof.

[Manufacturing Method of the Semiconductor Device 10A]

Figure 19:
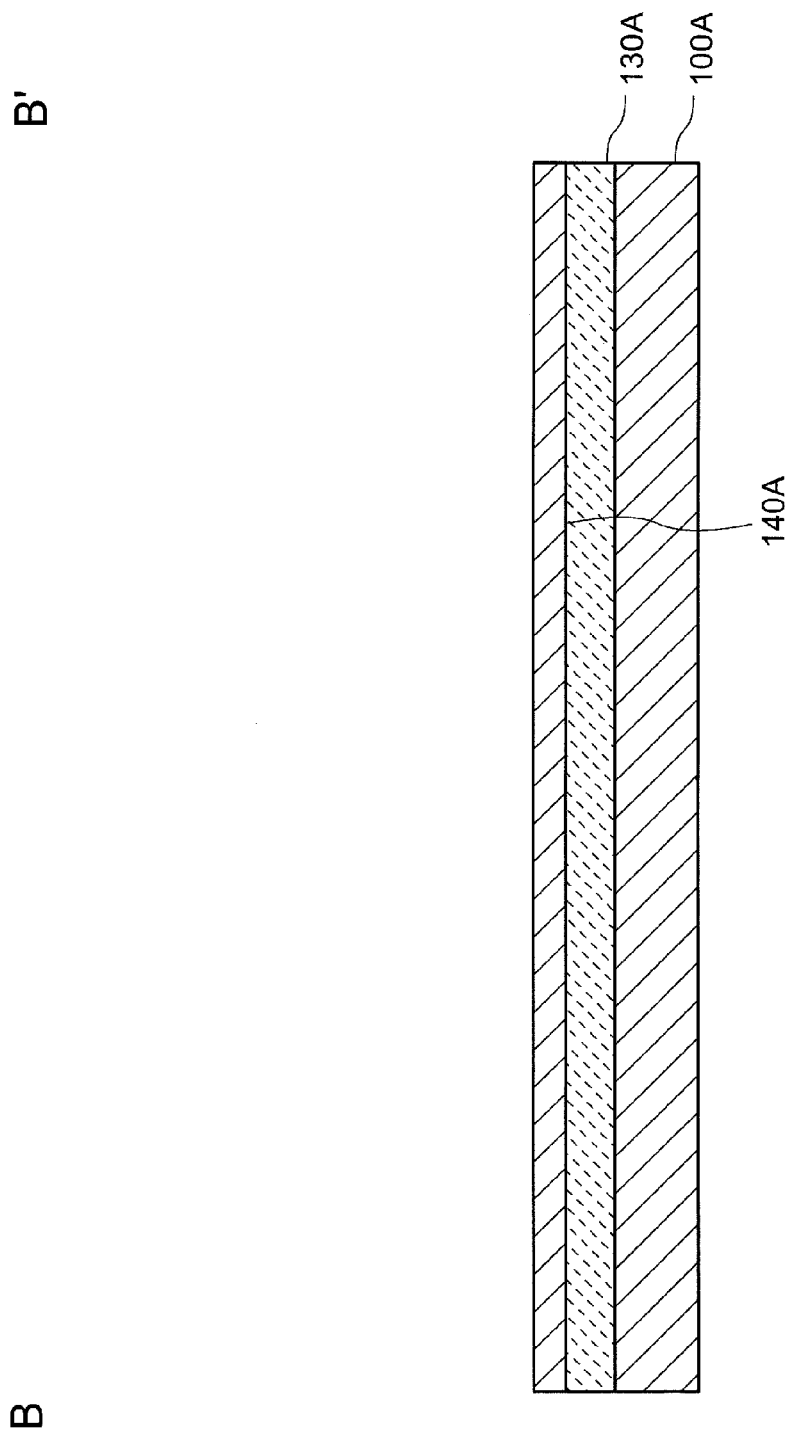
FIG. 19 is a cross-sectional view taken along line B-B' showing a step of forming an underlying layer in the manufacturing method of the semiconductor device in the embodiment according to the present invention.

With reference to FIG. 19 through FIG. 26, a manufacturing method of the semiconductor device 10A in embodiment 2 according to the present invention will be described. FIG. 19 through FIG. 26 are each a plan view of the semiconductor device 10A or a cross-sectional view of the semiconductor device 10A taken along line B-B' in the corresponding plan view. FIG. 19 is a cross-sectional view taken along line B-B' showing a step of forming the underlying layer in the manufacturing method of the semiconductor device 10A in embodiment 2 according to the present invention. Since no pattern is formed at this stage, a plan view is omitted. Referring to FIG. 19, the first barrier layer 130A and a film for the first oxide layer 140A are formed as the underlying layer above the substrate 100A.

Figure 20:
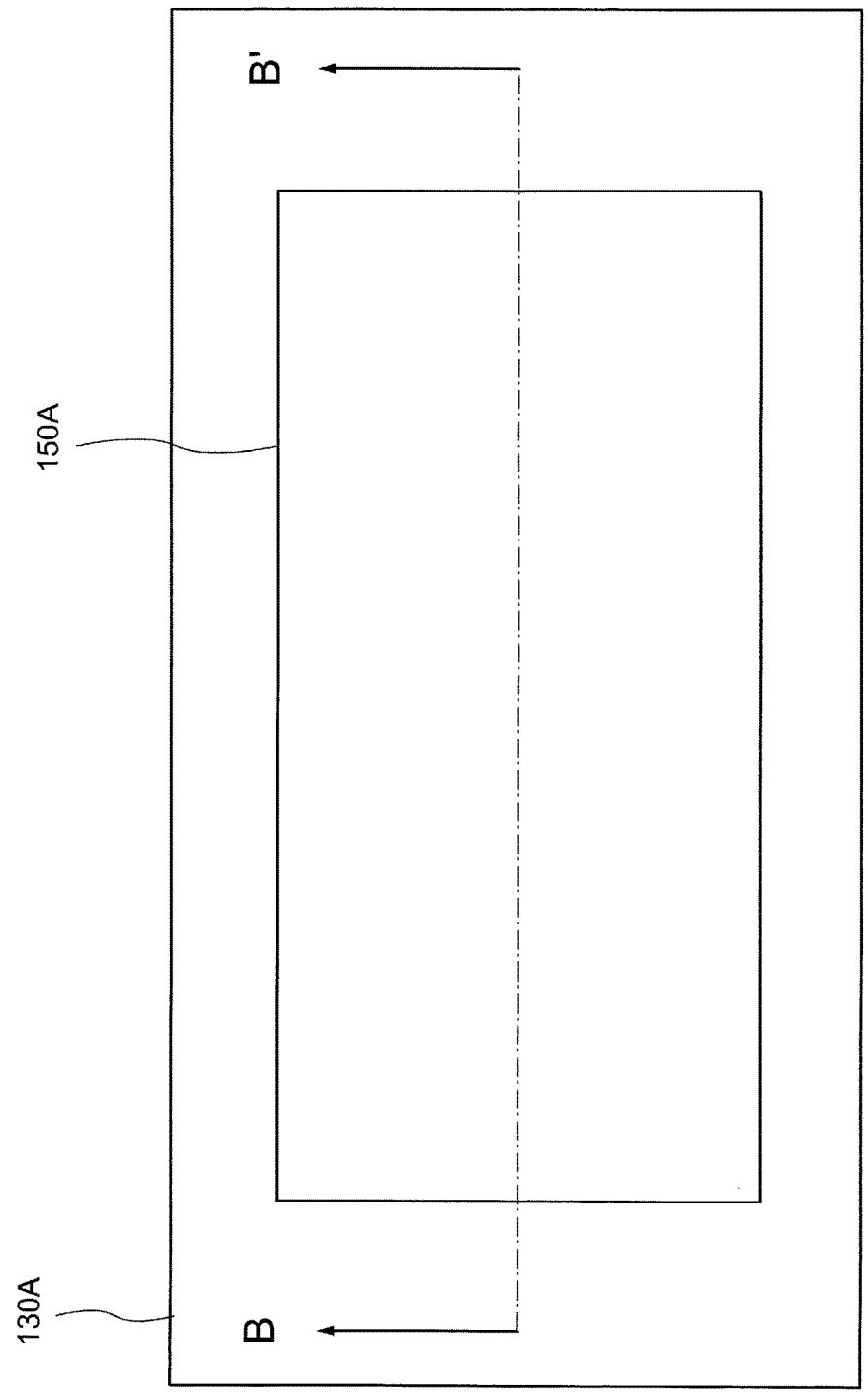
FIG. 20 is a plan view showing a step of forming an oxide semiconductor layer in the manufacturing method of the semiconductor device in the embodiment according to the present invention.
Figure 21:
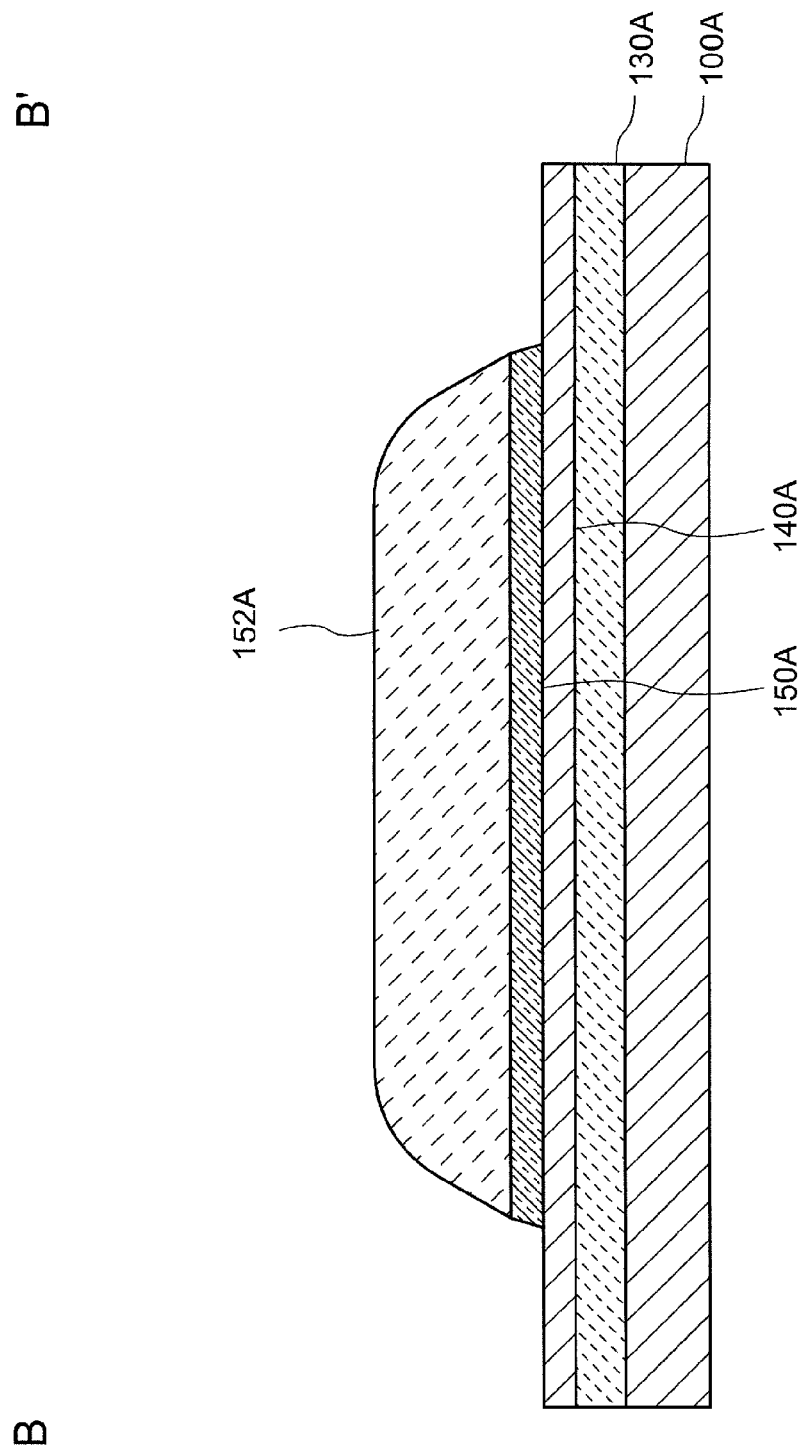
FIG. 21 is a cross-sectional view taken along line B-B' in FIG. 20 showing the step of forming the oxide semiconductor layer in the manufacturing method of the semiconductor device in the embodiment according to the present invention.

FIG. 20 and FIG. 21 are respectively a plan view and a cross-sectional view taken along line B-B' shown in FIG. 20 showing a step of forming the oxide semiconductor layer 150A in the manufacturing method of the semiconductor device 10A in embodiment 2 according to the present invention. Referring to FIG. 21, a film for the oxide semiconductor layer 150A is formed above the film for the first oxide layer 140A, and is etched by use of a resist mask 152A, formed by photolithography and etching, to form the oxide semiconductor layer 150A shown in FIG. 20.

The oxide semiconductor layer 150A may be formed by sputtering. The etching for forming the oxide semiconductor layer 150A may be dry etching or wet etching. In the case where the oxide semiconductor layer 150A is formed by wet etching, an etchant containing oxalic acid, an etchant containing phosphoric acid, or an etchant containing hydrogen fluoride may be used. The etching for forming the oxide semiconductor layer 150A is performed under the condition that the etching rate ratio of the oxide semiconductor layer 150A with respect to the film for the first oxide layer 140A is high. Namely, the film for the first oxide layer 140A acts as an etching stopper for the oxide semiconductor layer 150A.

Figure 22:
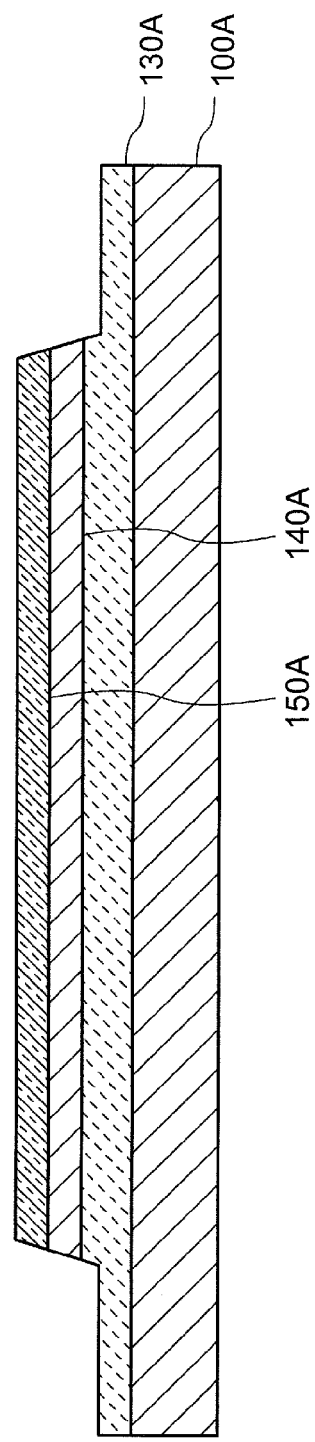
FIG. 22 is a cross-sectional view taken along line B-B' in FIG. 20 showing a step of forming a first oxide layer by etching and exposing a first barrier layer in the manufacturing method of the semiconductor device in the embodiment according to the present invention.

FIG. 22 is a cross-sectional view taken along line B-B' shown in FIG. 19 showing a step of forming the first oxide layer 140A by etching and exposing the first barrier layer 130A in the manufacturing method of the semiconductor device 10A in embodiment 2 according to the present invention. As described above, the film for the first oxide layer 140A is etched by use of the oxide semiconductor layer 150A, formed by patterning, as a mask to form the first oxide layer 140A and to expose the first barrier layer 130A. The etching for forming the oxide semiconductor layer 140A is dry etching performed by use of fluorine-containing gas. Examples of the fluorine-containing gas usable for the dry etching include CF4, CHF3, C2F6, SF6 and the like. These types of gas may be used independently or as a mixture of any thereof. For example, the dry etching may be performed by use of mixed gas of CF4 and CHF3. The dry etching may be RIE, or a plasma process performed by use of any of the above-described types of gas.

With the above-described etching, the oxide semiconductor layer 150A is not etched almost at all. Therefore, the oxide semiconductor layer 150A and the first oxide layer 140A have substantially the same pattern as each other seen in a plan view. Even in the case where the oxide semiconductor layer 150A is etched by the above-described dry etching, the etched amount of the oxide semiconductor layer 150A is smaller than the etched amount of the film for the first oxide layer 140A and the etched amount of the first barrier layer 130A. Therefore, the oxide semiconductor layer 150A and the first oxide layer 140A have substantially the same pattern as each other as seen in a plan view.

In the step shown in FIG. 22, the region of the first barrier layer 130A that is exposed by the dry etching is half-etched (or over-etched) in order to suppress the film for the first oxide layer 140A from unnecessarily remaining on the first barrier layer 130A. Namely, the film for the first oxide layer 140A is etched such that the region of the first barrier layer 130A that is exposed from the first oxide layer 140A is thinner than the region of the first barrier layer 130A that is below the first oxide layer 140A.

In the above, the resist mask 152A is removed, and the oxide semiconductor layer 150A formed by patterning is used as a mask to form the first oxide layer 140A by etching. The method for forming the first oxide layer 140A by etching is not limited to this. For example, the first oxide layer 140A may be formed by etching by use of the resist mask 152A. In this case, the oxide semiconductor layer 150A and the first oxide layer 140A may be formed in the same etching step. Alternatively, the film for the oxide semiconductor layer 150A may be etched by wet etching to a position inner to an end of the resist mask 152A, and the film for the first oxide layer 140A may be etched by use of the resist mask 152A. In this case, the pattern of the oxide semiconductor layer 150A is inner to the pattern of the first oxide layer 140A as seen in a plan view.

Figure 23:
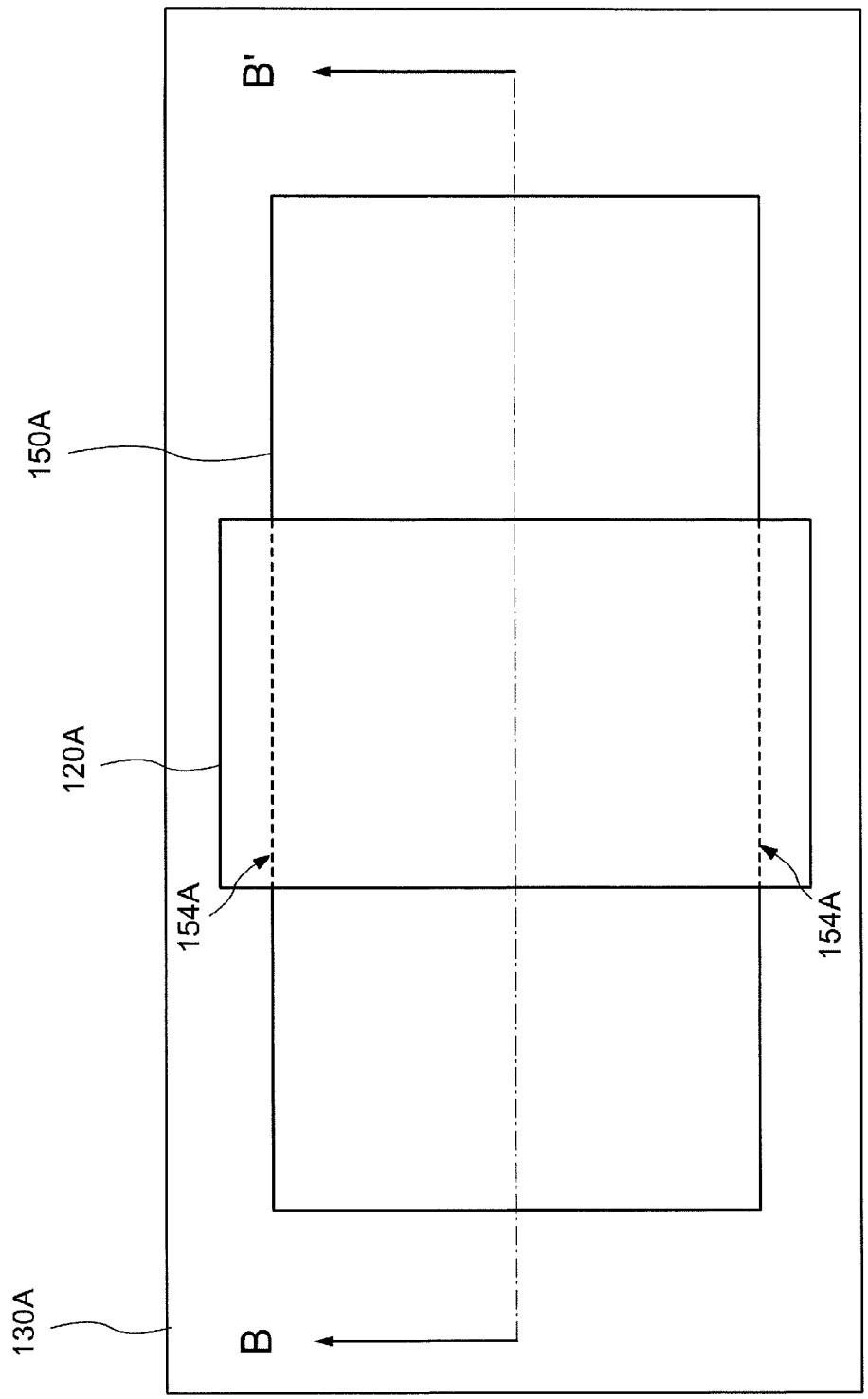
FIG. 23 is a plan view showing a step of forming a gate electrode and a gate insulating layer in the manufacturing method of the semiconductor device in the embodiment according to the present invention.
Figure 24:
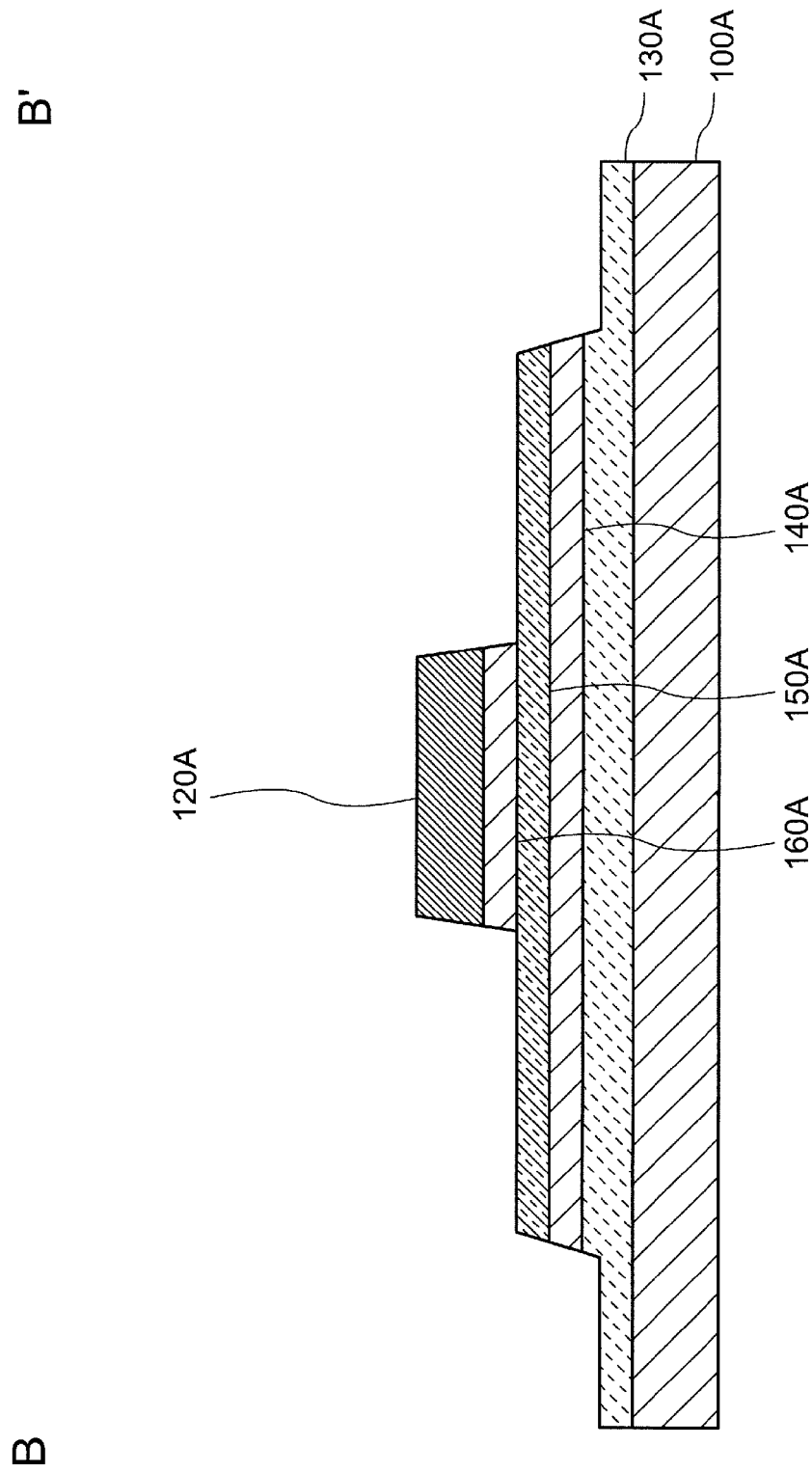
FIG. 24 is a cross-sectional view taken along line B-B' in FIG. 23 showing the step of forming the gate electrode and the gate insulating layer in the manufacturing method of the semiconductor device in the embodiment according to the present invention.

FIG. 23 and FIG. 24 are respectively a plan view and a cross-sectional view taken along line B-B' shown in FIG. 23 showing a step of forming the gate electrode 120A and the gate insulating layer in the manufacturing method of the semiconductor device 10A in embodiment 2 according to the present invention. Referring to FIG. 24, a film for the second semiconductor layer 160A and a film for the gate electrode 120A are formed above the oxide semiconductor layer 150A, and are patterned by photolithography and etching to form the second oxide layer 160A and the second electrode 120A partially exposing the oxide semiconductor layer 150A as shown in FIG. 23.

The second oxide layer 160A and the gate electrode 120A are formed above the region of the oxide semiconductor layer 150A that is to be the channel. The source region and the drain region of the oxide semiconductor layer 150A are exposed from the second oxide layer 160A and the gate electrode 120A. As shown in FIG. 23, the second oxide layer 160A is formed to cover ends 154A of the oxide semiconductor layer 150A. The ends 154A of the oxide semiconductor layer 150A, which are influenced by etching or the like to easily have properties thereof fluctuate, are protected by the second oxide layer 160A. Therefore, the characteristics of the semiconductor device 10A are suppressed from fluctuating.

Figure 25:
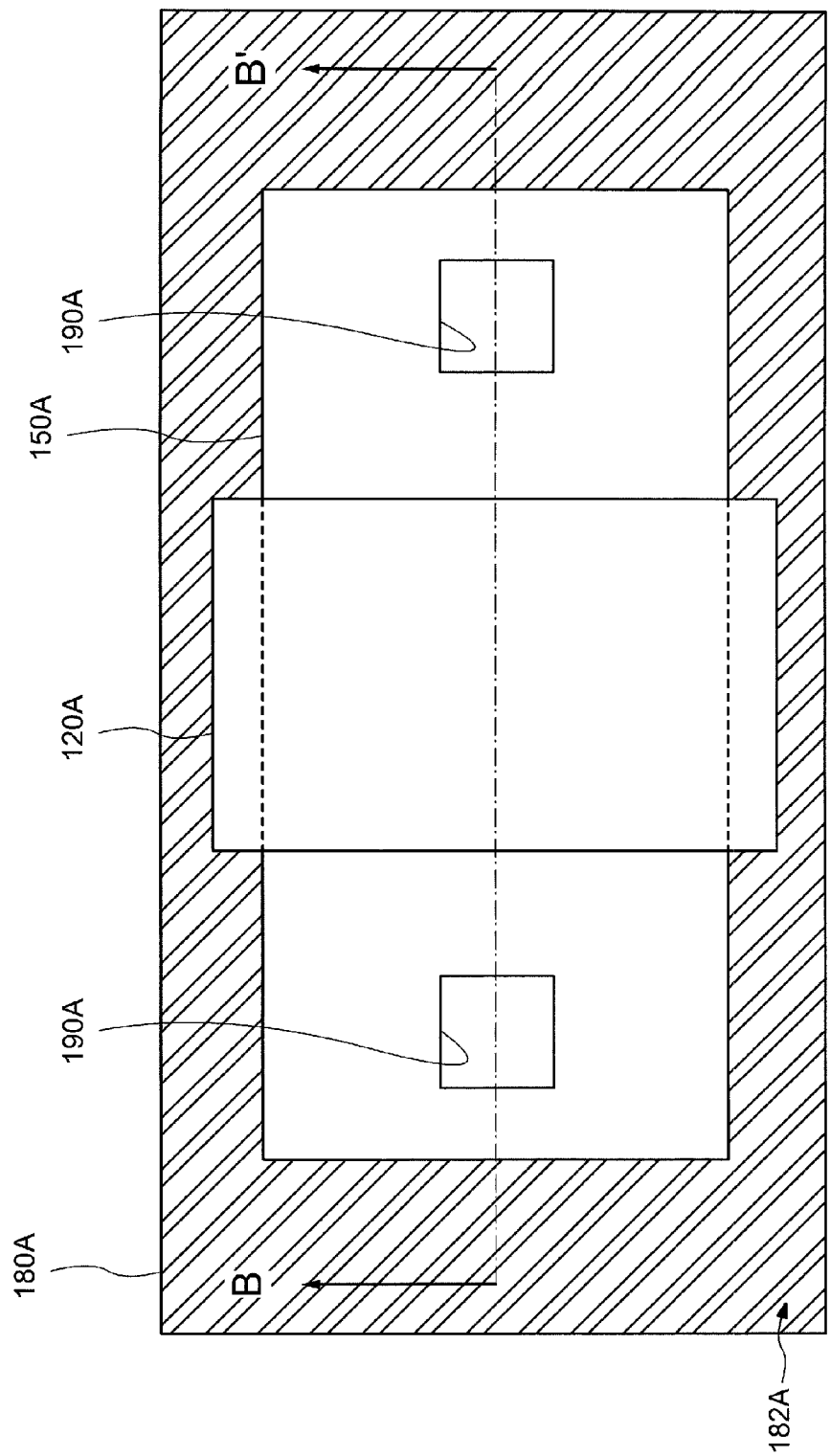
FIG. 25 is a plan view showing a step of forming a second barrier layer in the manufacturing method of the semiconductor device in the embodiment according to the present invention.
Figure 26:
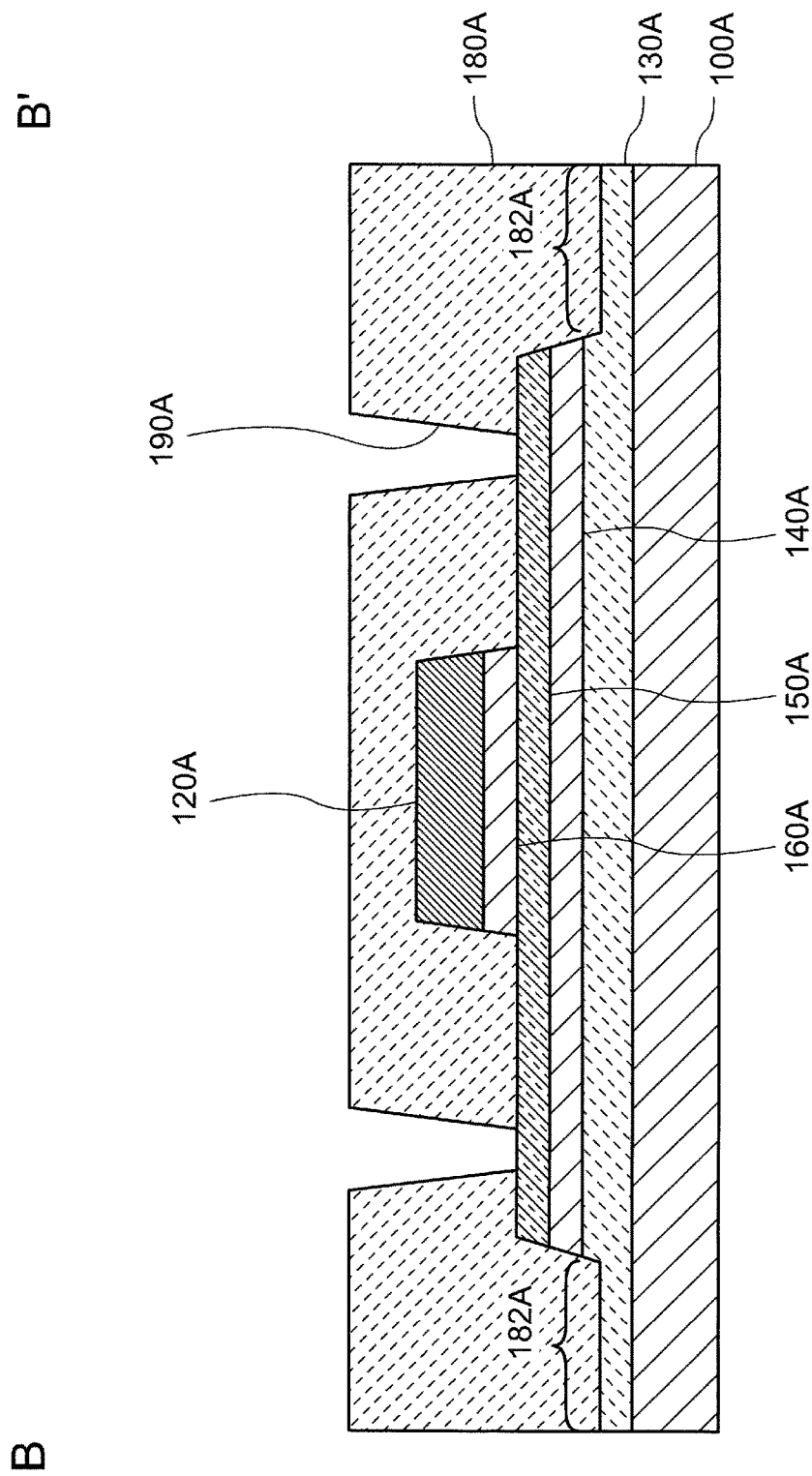
FIG. 26 is a cross-sectional view taken along line B-B' in FIG. 25 showing the step of forming the second barrier layer in the manufacturing method of the semiconductor device in the embodiment according to the present invention.

FIG. 25 and FIG. 26 are respectively a plan view and a cross-sectional view taken along line B-B' shown in FIG. 25 showing a step of forming the second barrier layer 180A in the manufacturing method of the semiconductor device 10A in embodiment 2 according to the present invention. Referring to FIG. 26, the second barrier layer 180A is formed above the gate electrode 120A, above the oxide semiconductor layer 150A and above the first barrier layer 130A, and the openings 190A are formed in the second barrier layer 180A by photolithography and etching as shown in FIG. 25 and FIG. 26. As shown in FIG. 26, the first barrier layer 130A and the second barrier layer 180A are in contact with each other in the barrier layer contact region 182A, which is represented by inclining lines in FIG. 25. As shown in FIG. 25, the barrier layer contact region 182A surrounds the oxide semiconductor layer 150A.

Then, a conductive film for the source and drain electrodes 170A is formed on the substrate shown in FIG. 25 and FIG. 26, and is patterned by photolithography and etching to form the source and drain electrodes 170A as shown in FIG. 17, FIG. 18A and FIG. 18B. The semiconductor device 10A in embodiment 2 according to the present invention is manufactured by the manufacturing method described above.

In the manufacturing method of the semiconductor device 10A in embodiment 2 according to the present invention described above, the first oxide layer 140A is formed by dry etching by use of fluorine-containing gas. Therefore, the oxide semiconductor layer 150A, even though being exposed, are suppressed from being etched, and the oxide semiconductor layer 150A exposed to the fluorine-containing gas is suppressed from being damaged. This allows the first oxide layer 140A to be formed by etching by use of the oxide semiconductor layer 150A as a mask. As a result, the pattern of the oxide semiconductor layer 150A is reflected on the pattern of the first oxide layer 140A. Ends of the pattern of the oxide semiconductor layer 150A and ends of the pattern of the first oxide layer 140A are made continuous to each other as seen in a cross-sectional view. This suppresses the problem that, for example, the layer(s) formed thereon is(are) discontinued.

<Modification of Embodiment 2>

Figure 27:
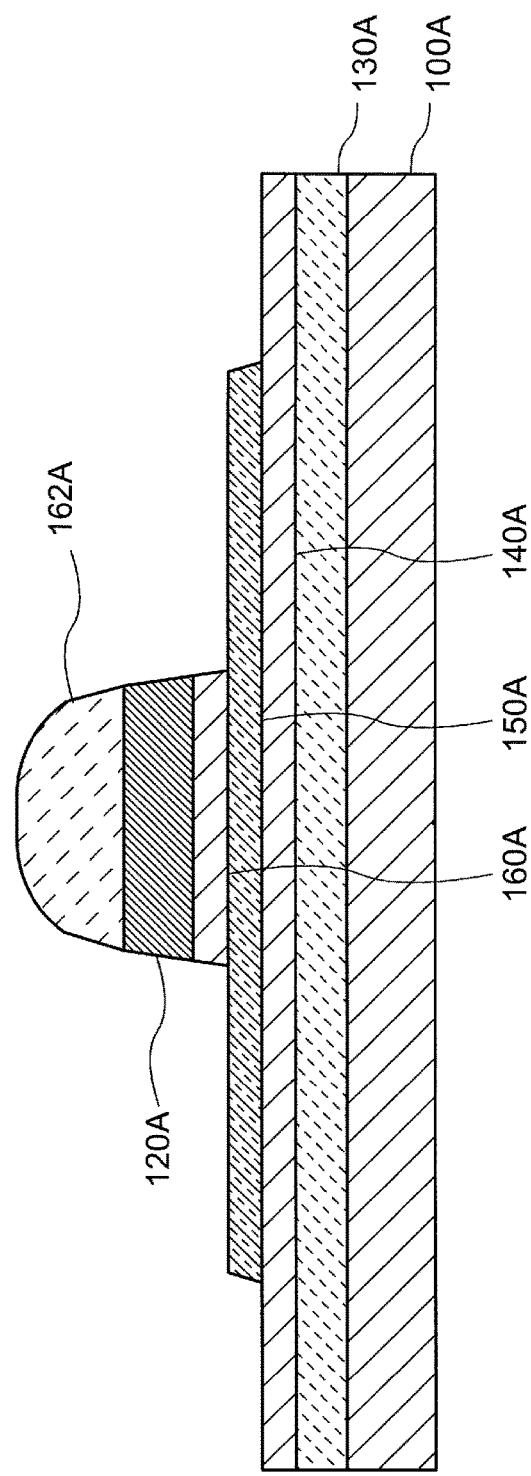
FIG. 27 is a cross-sectional view taken along line B-B' showing a step of forming a gate electrode and a gate insulating layer in a manufacturing method of a semiconductor device in a modification of the embodiment according to the present invention.
Figure 28:
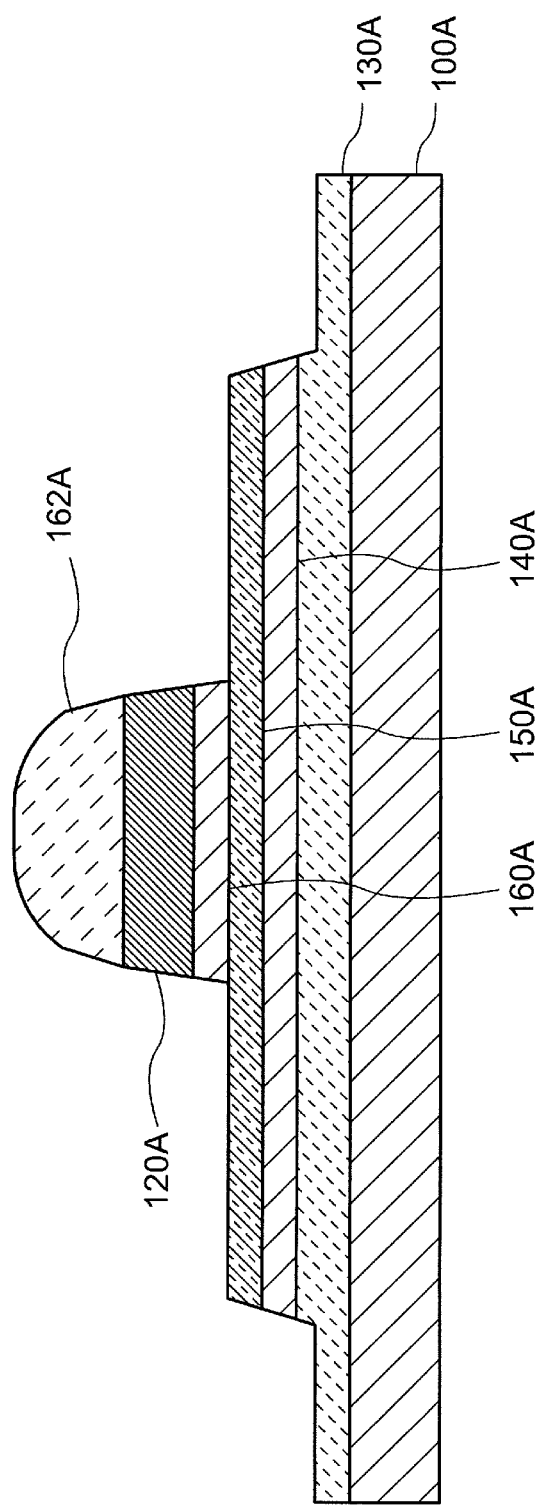
FIG. 28 is a cross-sectional view taken along line B-B' showing a step of forming a first oxide layer by etching and exposing a first barrier layer in the manufacturing method of the semiconductor device in the modification of the embodiment according to the present invention.

With reference to FIG. 27 and FIG. 28, a modification of embodiment 2 according to the present invention will be described. A manufacturing method of a semiconductor device in the modification of embodiment 2 is similar to the manufacturing method of the semiconductor device 10A in embodiment 2. In the following description, components that have the same structure and the function as those of the semiconductor device 10A bear the identical reference signs thereto, and detailed descriptions thereof may be omitted. In the modification of embodiment 2, the manufacturing method up to the step of forming the oxide semiconductor layer 150A is substantially the same as that of the semiconductor device 10A in embodiment 2 described with reference to FIG. 19 through FIG. 21, and thus will not be described.

FIG. 27 is a cross-sectional view taken along line B-B' showing a step of forming the gate electrode 120A and the gate insulating layer in the manufacturing method of the semiconductor device in the modification of embodiment 2 according to the present invention. In embodiment 2 (see FIG. 24), the first barrier layer 130A is exposed and then the second oxide layer 160A is formed. In the modification of embodiment 2, the second oxide layer 160A and the gate electrode 120A are formed before the first barrier layer 130A is exposed, namely, before the film for the first oxide layer 140A is etched to form the first oxide layer 140A. Specifically, after the oxide semiconductor layer 150A is formed by patterning but before the first barrier layer 130 is exposed, the film for the second oxide layer 160A and the film for the gate electrode 120A are formed above the oxide semiconductor layer 150A. Then, the film for the gate electrode 120A and the film for the second oxide layer 160A are etched by use of a resist mask 162A formed above the film for the gate electrode 120A, such that the gate electrode 120A and the second oxide layer 160A cover a region of the oxide semiconductor layer 150A that is to be a channel. The etching for forming the gate electrode 120A and the etching for forming the second oxide layer 160A may be performed in different steps.

FIG. 28 is a cross-sectional view taken along line B-B' showing a step of forming the first oxide layer 140A by etching and exposing the first barrier layer 130A in the manufacturing method of the semiconductor device in the modification of embodiment 2 according to the present invention. The first oxide layer 140A is formed by etching and the first barrier layer 130A is over-etched and thus exposed by the same etching step as for forming the second oxide layer 160A. Then, the resist mask 162A is removed to provide the substrate in the same state as that shown in FIG. 24. The manufacturing method of the semiconductor device in the modification of embodiment 2 after this step is the substantially the same as that of the semiconductor device 10A in embodiment 2, and thus will not be described.

As described above, in the manufacturing method of the semiconductor device in the modification of embodiment 2 according to the present invention, one etching step exposes the first barrier layer 130A and also forms the second oxide layer 160A. Namely, the manufacturing method is shortened.

The present invention is not limited to any of the above-described embodiments or modifications, and may be appropriately altered without departing from the gist of the present invention.

What is claimed is:

1. A semiconductor device, comprising:
an oxide semiconductor layer;
a gate electrode facing the oxide semiconductor layer;
a gate insulating layer between the oxide semiconductor layer and the gate electrode;
a first barrier layer below the oxide semiconductor layer;
a second barrier layer above the oxide semiconductor layer, the second barrier layer covering a top surface and side surfaces of the oxide semiconductor layer and being in contact with the first barrier layer in a region around the oxide semiconductor layer;
a first oxide layer between the oxide semiconductor layer and the first barrier layer; and
a second oxide layer between the oxide semiconductor layer and the second barrier layer,
wherein the first barrier layer and the second barrier layer contain nitrogen.

2. The semiconductor device according to claim 1, wherein:
the gate electrode is below the oxide semiconductor layer; and
the gate insulating layer includes the first barrier layer and the first oxide layer.

3. The semiconductor device according to claim 2, wherein:
the first oxide layer has substantially the same pattern as that of the oxide semiconductor layer as seen in a plan view; and
a region of the first barrier layer exposed from the first oxide layer is thinner than a region of the first barrier layer below the first oxide layer.

4. The semiconductor device according to claim 2, further comprising a source electrode and a drain electrode between the second oxide layer and the second barrier layer, the source electrode and the drain electrode being connected with the oxide semiconductor layer.

5. The semiconductor device according to claim 1, wherein:

the gate electrode is above the oxide semiconductor layer; and
the gate insulating layer includes the second oxide layer.

6. The semiconductor device according to claim 5, wherein the second barrier layer is above the oxide semiconductor layer, the gate insulating layer and the gate electrode.

7. The semiconductor device according to claim 6, wherein a region of the oxide semiconductor layer exposed from the second oxide layer is in contact with the second barrier layer.

8. The semiconductor device according to claim 7, wherein the region of the oxide semiconductor layer exposed from the second oxide layer has a resistivity lower than that of a region of the oxide semiconductor layer below the second oxide layer.

9. The semiconductor device according to claim 6, wherein:
the first oxide layer has substantially the same pattern as that of the oxide semiconductor layer as seen in a plan view; and
a region of the first barrier layer exposed from the first oxide layer is thinner than a region of the first barrier layer below the first oxide layer.

10. The semiconductor device according to claim 6, further comprising a source electrode and a drain electrode respectively connected with a source region and a drain region of the oxide semiconductor layer;
wherein:
the second barrier layer has openings reaching the source region and the drain region; and
the source electrode and the drain electrode are in the openings.

11. A manufacturing method of a semiconductor device, comprising:
forming a first barrier layer;
forming a first oxide layer above the first barrier layer;
forming an oxide semiconductor layer above the first oxide layer;
performing fluorine etching using fluorine-containing gas on a region of the first oxide layer exposed from the oxide semiconductor layer to expose a region of the first barrier layer;
forming a second oxide layer above the oxide semiconductor layer, the second oxide layer partially exposing the oxide semiconductor layer; and
forming a second barrier layer in contact with the exposed region of the first barrier layer in a region surrounding the oxide semiconductor layer.

12. A manufacturing method of a semiconductor device, comprising:
forming a first barrier layer;
forming a first oxide layer above the first barrier layer;
forming an oxide semiconductor layer above the first oxide layer;
forming a second oxide layer above the oxide semiconductor layer;
performing fluorine etching using fluorine-containing gas on a region of the second oxide layer exposed from a mask partially covering the oxide semiconductor layer and on a region of the first oxide layer exposed from the oxide semiconductor layer to expose a region of the first barrier layer; and
forming a second barrier layer in contact with the exposed region of the first barrier layer in a region surrounding the oxide semiconductor layer.

13. The manufacturing method of a semiconductor device according to claim 11, wherein the exposed region of the first barrier layer is over-etched by the fluorine etching.

14. The manufacturing method of a semiconductor device according to claim 11, further comprising forming a gate electrode;
wherein the first barrier layer is formed above the gate electrode.

15. The manufacturing method of a semiconductor device according to claim 14, further comprising:
forming a conductive layer above the second oxide layer; and
etching the conductive layer by use of the second oxide layer as an etching stopper to form a source electrode and a drain electrode;
wherein:
the second oxide layer is formed to cover a region of the oxide semiconductor layer to be a channel; and
the second barrier layer is formed above the source electrode and the drain electrode.

16. The manufacturing method of a semiconductor device according to claim 11, further comprising forming a gate electrode above the second oxide layer;
wherein the second barrier layer is formed above the gate electrode.

17. The manufacturing method of a semiconductor device according to claim 11, further comprising:
forming a gate electrode above the second oxide layer; and
performing the fluorine etching on a region of the first oxide layer exposed from the oxide semiconductor layer to expose the first barrier layer.

18. The manufacturing method of a semiconductor device according to claim 16, further comprising:
forming openings in the second barrier layer, the openings reaching a source region and a drain region of the oxide semiconductor layer; and
forming a source electrode and a drain electrode in the openings, the source electrode and the drain electrode being connected with the oxide semiconductor layer.

* * * * *